(12) United States Patent
Daiber

(10) Patent No.: US 6,816,516 B2
(45) Date of Patent: Nov. 9, 2004

(54) ERROR SIGNAL GENERATION SYSTEM

(75) Inventor: Andrew Daiber, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 523 days.

(21) Appl. No.: 09/814,464

(22) Filed: Mar. 21, 2001

(65) Prior Publication Data

US 2002/0136104 A1 Sep. 26, 2002

(51) Int. Cl.[7] .................................................. H01S 3/10
(52) U.S. Cl. ...................... 372/20; 372/19; 372/29.015; 372/32; 372/98; 372/102
(58) Field of Search ........................ 372/19, 20, 29.015, 372/32, 98, 102

(56) References Cited

U.S. PATENT DOCUMENTS

| | | | |
|---|---|---|---|
| 3,628,173 A | * | 12/1971 | Danielmeyer ................. 372/20 |
| 3,676,799 A | * | 7/1972 | Danielmeyer ................. 372/32 |
| 3,788,743 A | | 1/1974 | George |
| 3,899,748 A | | 8/1975 | Bodlaj |
| 3,921,099 A | | 11/1975 | Abrams et al. |
| 3,965,440 A | | 6/1976 | Graves |
| 4,410,992 A | | 10/1983 | Javan |
| 4,460,977 A | | 7/1984 | Shimada et al. |
| 4,730,105 A | | 3/1988 | Mitschke et al. |
| 4,847,854 A | | 7/1989 | Van Dijk |
| 4,934,816 A | | 6/1990 | Silver et al. |
| 5,022,745 A | | 6/1991 | Zayhowski et al. |
| 5,124,993 A | | 6/1992 | Braunlich et al. |
| 5,163,063 A | | 11/1992 | Yoshikawa et al. |
| 5,181,214 A | | 1/1993 | Berger et al. |
| 5,289,491 A | | 2/1994 | Dixon |
| 5,319,441 A | * | 6/1994 | Terada et al. ................ 356/454 |
| 5,412,676 A | | 5/1995 | Schnier et al. |
| 5,414,280 A | | 5/1995 | Girmay |
| 5,418,800 A | | 5/1995 | Prior et al. |
| 5,428,700 A | | 6/1995 | Hall |
| 5,444,724 A | | 8/1995 | Goto |
| 5,673,129 A | | 9/1997 | Mizrahi |
| 5,751,750 A | | 5/1998 | Friede et al. |
| 5,777,773 A | | 7/1998 | Epworth et al. |
| 5,812,716 A | | 9/1998 | Ohishi |

(List continued on next page.)

FOREIGN PATENT DOCUMENTS

| | | |
|---|---|---|
| WO | WO 98/05105 | 2/1998 |
| WO | WO 00/49689 | 8/2000 |
| WO | WO 01/04999 A1 | 1/2001 |
| WO | WO 02/078137 A1 | 10/2002 |
| WO | WO 03/005500 A2 | 1/2003 |
| WO | WO 03/005501 A2 | 1/2003 |
| WO | WO 03/005512 A2 | 1/2003 |

OTHER PUBLICATIONS

Ketelsen, L. J. P., "Simple Technique for Measuring Cavity Loss in Semiconductor Laser," *Electronics Letters*, (Aug. 18, 1994), vol. 30, No. 17, pp. 1422–1424.

Shtengel, G. E., et al., "Internal Optical Loss Measurements in 1.3um InGaAsP Lasers," *Electronic Letters*, (Jul. 6, 1995), vol. 31, No. 14, pp. 1157–1159.

*Primary Examiner*—Leon Scott, Jr.
(74) *Attorney, Agent, or Firm*—Blakely, Sokoloff, Taylor & Zafman LLP

(57) ABSTRACT

An error signal generation system and method for continuous and accurate positioning of a tunable element used in association with a coherent light source. A tunable element is positioned in a coherent light beam with a fixed frequency or wavelength, and a detector is positioned in association with the light beam and tunable element that is capable of generating an error signal indicative of spatial losses associated with the positioning of the tunable element in the light beam. A tuning assembly is operatively coupled to the tunable element and detector and is configured to position the tunable element according to the error signal generated by the detector.

32 Claims, 17 Drawing Sheets

U.S. PATENT DOCUMENTS

| | | | |
|---|---|---|---|
| 5,848,092 A | 12/1998 | Mitsumoto et al. | |
| 5,872,881 A | 2/1999 | Rossi et al. | |
| 5,889,800 A | 3/1999 | Kafka et al. | |
| 5,917,188 A | 6/1999 | Atkinson et al. | |
| 5,943,352 A | 8/1999 | Fee | |
| 6,018,535 A | 1/2000 | Maeda | |
| 6,034,799 A | 3/2000 | Hansen | |
| 6,040,950 A | 3/2000 | Broome | |
| 6,041,071 A | 3/2000 | Tayebati | |
| 6,044,095 A | 3/2000 | Asano et al. | |
| 6,064,501 A | 5/2000 | Roberts et al. | |
| 6,081,539 A | 6/2000 | Mattori et al. | |
| 6,108,355 A * | 8/2000 | Zorabedian | 372/20 |
| 6,115,121 A | 9/2000 | Erskine | |
| 6,151,337 A | 11/2000 | Carlsten et al. | |
| 6,181,717 B1 | 1/2001 | Kner et al. | |
| 6,192,058 B1 | 2/2001 | Abeles | |
| 6,201,638 B1 | 3/2001 | Hall et al. | |
| 6,205,159 B1 | 3/2001 | Sesko et al. | |
| 6,215,802 B1 | 4/2001 | Lunt | |
| 6,229,835 B1 | 5/2001 | Tomaru et al. | |
| 6,249,365 B1 | 6/2001 | Mizrahi et al. | |
| 6,259,712 B1 | 7/2001 | DeCain et al. | |
| 6,263,004 B1 | 7/2001 | Arvidsson et al. | |
| 6,282,215 B1 * | 8/2001 | Zorabedian et al. | 372/20 |
| 6,301,280 B1 | 10/2001 | Broutin et al. | |
| 6,304,586 B1 | 10/2001 | Pease et al. | |
| 6,331,892 B1 * | 12/2001 | Green | 356/451 |
| 6,337,660 B1 | 1/2002 | Esman et al. | |
| 6,366,592 B1 | 4/2002 | Flanders | |
| 6,366,689 B1 | 4/2002 | Rao et al. | |
| 6,404,538 B1 | 6/2002 | Chen et al. | |
| 6,441,933 B1 | 8/2002 | Jang | |
| 6,470,036 B1 | 10/2002 | Bailey et al. | |
| 6,532,091 B1 | 3/2003 | Miyazaki et al. | |
| 2002/0048297 A1 | 4/2002 | Irie et al. | |
| 2002/0126345 A1 * | 9/2002 | Green et al. | 359/122 |
| 2002/0136104 A1 * | 9/2002 | Daiber | 369/44.23 |
| 2002/0172239 A1 * | 11/2002 | McDonald et al. | 372/20 |
| 2003/0016707 A1 * | 1/2003 | McDonald et al. | 372/20 |

* cited by examiner

ERROR SIGNAL GENERATION SYSTEM

BACKGROUND OF THE INVENTION

1. Field of Invention

This invention pertains to error signal generation and servo systems usable for positional control of optical elements in optical systems. More particularly, the invention pertains to an error signal generation system for continuous, accurate positional control of a tunable element with respect to a coherent light beam.

2. Description of the Background Art

Fiberoptic telecommunications are continually subject to demand for increased bandwidth. One way that bandwidth expansion has been accomplished is through wavelength division multiplexing (WDM) wherein multiple separate data streams exist concurrently in a single optical fiber, with modulation of each data stream occurring on a different channel. Each data stream is modulated onto the output beam of a corresponding semiconductor transmitter laser operating at a specific channel wavelength, and the modulated outputs from the semiconductor lasers are combined onto a single fiber for transmission in their respective channels. The International Telecommunications Union (ITU) presently require channel separations of approximately 0.4 nanometers, or about 50 GHz. This channel separation allows up to 128 channels to be carried by a single fiber within the bandwidth range of currently available fibers and fiber amplifiers. Improvements in fiber technology together with the ever-increasing demand for greater bandwidth will likely result in smaller channel separation in the future.

Transmitter lasers used in WDM systems have typically been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels. Continuously tunable external cavity lasers have been developed to overcome this problem.

The trend towards smaller channel separation and the advent of channel selectivity in transmitter lasers has given rise to a need for greater accuracy and control in the positioning of tunable elements associated with transmitter lasers. As tunable elements are configured for narrower channel separation, decreasing component tolerances and thermal fluctuation become increasingly important. Non-optimal positioning of tunable elements results in spatial losses and reduced transmitter output power.

SUMMARY OF THE INVENTION

The present invention relates to an error signal generation system and method for continuous and accurate tuning of a tunable element used in association with a coherent light source. In its most general terms, the invention comprises a coherent light beam with a fixed frequency or wavelength, a tunable element positioned in the light beam, and a detector, positioned in association with the light beam and tunable element, that is capable of generating an error signal indicative of a characteristic or property associated with the relationship of the element and the light beam. The invention also may comprise a tuning assembly operatively coupled to the tunable element and detector and configured to tune the tunable element according to the error signal generated by the detector.

The tunable element defines at least one characteristic or property with respect to the coherent light beam which is adjustable according to the error signal derived from the detector. For example, the tunable element may define a constructive interference fringe for the coherent light beam, with non-optimal tuning of the tunable element resulting in the constructive interference fringe being non-centered with respect to the light beam, resulting in spatial losses to the beam as it is transmitted through or reflected off the tunable element. The detector is positioned to detect such spatial losses and generate a corresponding error signal, which is usable to re-center the constructive interference fringe in the coherent light beam.

In certain embodiments the detector is a split detector, and non-optimal tuning of the tunable element such that the constructive interference fringe is not centered within the light beam will result in unequal amounts of optical power being detected by the two halves of the split detector. The voltage outputs of the detector halves are utilized to generate an error signal which corresponds to or is indicative of the optical power received by the different halves of the split detector. The error signal generated by the detector is used to tune the tunable element by adjusting a property of the tunable element by the tuning assembly so that the constructive interference fringe defined by the tunable element remains centered in the coherent light beam. In other embodiments the detector may comprise various types of multi-element detector, or a lateral effect detector.

The tunable element, in one embodiment, comprises a tapered or "wedge" etalon which may, for example, be in the form of an air gap between reflective surfaces of adjacent substrates, a single, solid substrate with tapered reflective surfaces, or a tapered thin film interference filter. The wedge etalon defines a constructive interference fringe for the wavelength of the coherent light beam. The tuning assembly may comprise a mechanical, electrical, piezoelectric or like system configured drive or translate the wedge etalon with respect to the light beam, or to apply a voltage, magnetic field, mechanical stress, or other effect which alters the characteristics of the wedge etalon. The tuning assembly may comprise, for example, a stepper motor that is configured to translate the wedge etalon such that the constructive interference fringe is moved with respect to the center of light beam.

The tunable element of the invention may alternatively comprise an air gap etalon embodied in a micro electrical mechanical system (MEMS) device wherein the air gap etalon is defined by parallel, reflective micro-machined silicon surfaces. The tuning assembly for this embodiment may comprise, for example, electrodes associated with the reflective surfaces of the air gap. The optical thickness of the air gap etalon is controlled by positioning one or both reflective surfaces according to voltage applied to the electrodes to vary the optical path length of the air gap. One or more of the electrodes are operatively coupled to the split detector, and the potential applied to the electrodes for control of the air gap spacing is responsive to the error signal derived from the split detector.

In another embodiment of the invention the tunable element comprises an electro-optic device having an effective optical path length or optical thickness that is adjustable according to an applied electric field, magnetic field, mechanical stress via gas pressure or other source, thermal, or non-linear optical effect. The electro-optic device may comprise, for example a substrate made of a electro-optic material such as a liquid crystalline material wherein the refractive index of the substrate can be varied by suitable application of voltage to the substrate. The tuning assembly in this case comprises electrodes associated with the electro-optic material substrate which are suitably positioned to control the refractive index of the etalon electro-optic substrate material.

In another embodiment the tunable element may comprise an air gap etalon defined by reflective surfaces which are movable via a piezoelectric material associated with the reflective surfaces wherein the air gap separation can be varied by suitable application of voltage to the piezoelectric material. The tunable element may comprise an air gap etalon with reflective surfaces that are movable via thermal control, using thermal expansion and contraction via heating and cooling of a spacer associated with the reflective surfaces to provide tuning.

In another embodiment of the invention the tunable element comprises a grating or like retroreflective element positioned in the coherent light beam. The constructive interference fringe in this embodiment is defined by the grating spacing and angular relationship of the grating and light beam. The tuning assembly comprises a mechanical, electrical, piezoelectric or like system configured to rotate or otherwise control the angle of the grating with respect to the light beam according to the error signal from the detector. The detector may be positioned for detection of light transmitted through or reflected from the grating. The grating may be chirped and configured for near field detection by the split detector. The grating may be un-chirped and the detector is positioned for far field detection, with suitable collimating optics positioned to direct light from the grating to the split detector. The grating may be positioned in an external cavity laser in a Littrow or Litman-Metcalf configuration, or other configuration.

The error signal generation system of the invention may be embodied in an external cavity laser apparatus wherein the tunable element is located within or otherwise associated with the external cavity and is positionable to provide selected transmission channel wavelengths. The external cavity laser will comprise a gain medium emitting a coherent light beam along an optical path, and an end mirror positioned in the optical path. The end mirror and a rear reflective facet of the gain medium define the external laser cavity. The gain medium may comprises an emitter chip which emits the coherent light beam along an optical path, with the tunable element located within the cavity and positioned in the optical path. The detector may be positioned in the optical path after the end mirror. A tuning assembly is operatively coupled to the tunable element and to the detector.

A grid generator element is included in association with the external cavity laser for wavelength locking and is positioned in the optical path between the gain medium and end mirror. The grid generator element may comprise, for example, a grid etalon having a free spectral range corresponding to the spacing between the gridlines of a selected wavelength grid such as the ITU wavelength grid. The tunable element may, in one embodiment, comprise a wedge etalon which is positioned in the optical path within the external cavity laser between the gain medium and end mirror, so that the grid etalon is positioned between the gain medium and wedge etalon, and the wedge etalon is positioned between the grid etalon and end mirror, with the light beam passing through the grid etalon and wedge etalon along the optical path. Transmission wavelength channel selection according to the grid defined by the grid etalon is provided by positional adjustment of the tunable element and/or end mirror. Positioning of the wedge etalon for channel selection is carried out by driving the wedge to selected or appropriate positions wherein the optical thickness of the wedge etalon corresponds to an integral multiple of the half wavelength for the selected channels.

The wedge etalon acts as an interference filter, with the tapered shape of the etalon defining a constructive interference fringe, as noted above. In order to avoid spatial losses to the beam passing through the wedge etalon, the constructive interference fringe defined by the wedge etalon must be centered in the optical path defined by the beam. The detector, which receives the beam passing through the wedge etalon, is configured to generate or provide a difference error signal indicative of the position of the constructive interference fringe in the beam, and hence any spatial losses to the beam associated with the position of the constructive interference fringe. The detector may be a split detector or other multi-element detector, a lateral effect detector, or other type of detector.

When the constructive interference fringe is centered in the optical path, the optical power received by the two halves of the split detector will be equal, and the difference error signal derived from the detector will nominally be zero. When the constructive interference fringe is not properly centered, the resulting spatial losses to the beam result in a beam spot on the split detector that is truncated, such that the two detector halves receive different levels of optical power, and a non-zero difference error signal results. The tuning assembly re-positions the wedge etalon according to the error signal so that the constructive interference fringe is centered in the beam. The position of the constructive interference fringe defined by the wedge etalon is continuously adjusted according to error signals from the split detector to maintain the constructive interference fringe in the center of the beam and avoid spatial losses associated with non-optimal positioning of the wedge etalon. The positional adjustment of the wedge etalon in this manner also avoids unintended channel changing in the external cavity laser.

The tuning assembly used to adjust the position the wedge etalon according to the error signals derived from the detector may comprise the same mechanical drive or translation assembly used for channel selection with the wedge etalon. Thus, in the operation of the external cavity laser, channel selections will periodically be made by driving the wedge etalon to predetermined positions. Servoing the position of the wedge etalon is carried out continuously at each channel wavelength to avoid spatial losses to the beam.

In other embodiments, the tunable element used in the external cavity may alternatively comprise a grating, with the grating angle servoed according to the error signal derived from the split detector. In still other embodiments, the tunable element may comprise a liquid crystal or ferroelectric material-based etalon in which the effective optical pathlength through the etalon is servoed via voltage controlled refractive index changes in the etalon material according to the error signals. Various components of the external cavity laser may be embodied in a MEMS device, with the tunable element comprising an air gap etalon with an optical path length adjustable by voltage controlled movement of a reflective surface, as also noted above.

The use of a split detector with an external cavity laser as provided by the invention also allows servoing of other optical components of the external cavity laser to error signals derived from the split detector. An end mirror tuning assembly may be included in association with the end mirror, and may comprises an oscillator element and a translator element. The translator may comprise an arm which is thermally positionable via a thermoelectric controller and thermistor, while the oscillator element comprises a piezoelectric element configured to periodically oscillate the end mirror. The thermoelectric controller is operatively coupled to the split detector via a sum signal generator and a phase compensator, and operates to thermally move the translator arm according to a phase corrected sum signal derived from the split detector. The oscillation of the end mirror via the piezoelectric element creates frequency shifts which allow tracking of amplitude modulation for servoing the end mirror. The drive current provided to the gain medium may also be servoed according to error signals derived from the split detector.

As will be apparent from the following detailed description, the invention provides an error signal generation system which prevents spatial losses in coherent optical systems, which generates error signals indicative of spatial losses associated with a coherent light beam, which provides for adjustment of a constructive interference fringe associated with a tunable element according error signals derived from a split detector, which is usable with a continuously tunable external cavity laser, and which allows adjustment of multiple optical components associated with an external cavity laser according to error signals derived from a single split detector. The error signal generation system of the invention can further be used for spectrally filtering out spontaneous emission light associated with a coherent light source.

BRIEF DESCRIPTION OF THE DRAWINGS

The present invention will be more fully understood by reference to the following drawings, which are for illustrative purposes only.

DETAILED DESCRIPTION

Referring more specifically to the drawings, for illustrative purposes the present invention is embodied in the apparatus and graphical data shown in FIG. 1 through FIG. 13. It will be appreciated that the apparatus may vary as to configuration and as to details of the parts, and that the method may vary as to details and the order of the steps, without departing from the basic concepts as disclosed herein. The invention is disclosed primarily in terms of use with an external cavity laser apparatus using a wedge etalon. However, it will be readily apparent to those skilled in the art that the invention may be used with various optical systems with different tunable elements, the details and specificities disclosed herein are only exemplary and should not be considered limiting.

The present invention provides an error signal generation system optical devices which allows adjustment of a tunable element positioned in association with a coherent beam control a tuning characteristic of the tunable element. The invention may be used, for example, to avoid spatial losses to the beam associated with improper positioning of the tunable element. The invention is applicable to continuously tunable external cavity lasers which employ a tunable element for channel selection. Examples of such tunable external cavity lasers are the subject of U.S. Pat. No. 6,108,355 (Zorabedian, "Continuously-Tunable External Cavity Laser"), U.S. application Ser. No. 09/418,950 by Zorabedian et al., entitled "Continuously-Tunable External Cavity Laser" and filed on Oct. 15, 1999, and U.S. application Ser. No. 09/507,557 by Zorabedian et al. entitled "Tunable Laser Transmitter With Internal Wavelength Grid Generators" and filed on Feb. 18, 2000, the disclosures of which are incorporated herein by reference.

Figure 1:
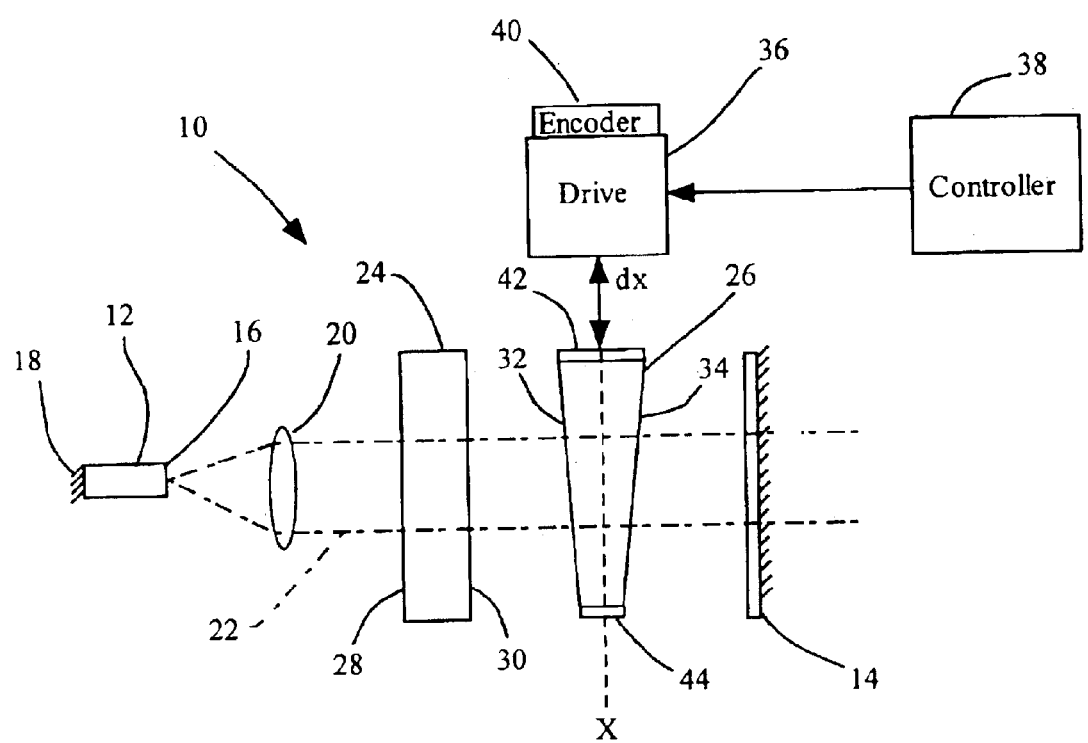
FIG. 1 is a schematic diagram of an external cavity laser apparatus utilizing a wedge etalon as a tunable element.

The invention will be more fully understood by first discussing the operation of a continuously tunable external cavity laser in which the invention may be employed. Referring to FIG. 1, there is shown external cavity laser apparatus 10 of the type described in U.S. Pat. No. 6,108,355. The apparatus 10 includes a gain medium 12 and an end or external reflective element 14. Gain medium 12 may comprise a conventional Fabry-Perot diode emitter chip and has a anti-reflection (AR) coated front facet 16 and a partially reflective rear facet 18. Retroreflective element 14 may comprise a end mirror. The external laser cavity is delineated by rear facet 18 and end mirror 14. Gain medium 12 emits a coherent beam from front facet 16 that is collimated by lens 20 to define an optical path 22 which is co-linear with the optical axis of the external cavity. Front and rear facets 16, 18 of gain medium 12 are aligned with the optical axis of the external cavity as well. Conventional output coupler optics (not shown) are associated with rear facet 18 for coupling the output of external cavity laser 10 into an optical fiber (also not shown).

The external cavity laser 10 includes a grid generator element and a tunable element, which are respectively shown in FIG. 1 as a grid etalon 26 and a wedge etalon 26 positioned in optical path 22 between gain medium 12 and end mirror 14. Grid etalon 24 typically is positioned in optical path 22 before tunable element 26, and has parallel reflective faces 28, 30. Grid etalon 24 operates as an interference filter, and the refractive index of grid etalon 24 and the optical thickness of grid etalon 24 as defined by the spacing of faces 28, 30 give rise to a multiplicity of minima within the communication band at wavelengths which coincide with the center wavelengths of a selected wavelength grid which may comprise, for example, the ITU (International Telecommunications Union) grid. Other wavelength grids may alternatively be selected. Grid etalon has a free spectral range (FSR) which corresponds to the spacing between the grid lines of the ITU grid, and the grid etalon 24 thus operates to provide a plurality of pass bands centered on each of the gridlines of the wavelength grid. Grid etalon 24 has a finesse (free spectral range divided by full width half maximum or FWHM) which suppresses neighboring modes of the external cavity laser between each channel of the wavelength grid.

Grid etalon 24 may be a parallel plate solid, liquid or gas spaced etalon, and may be tuned by precise dimensioning of the optical thickness between faces 28, 30 by thermal expansion and contraction via temperature control. The grid etalon 24 may alternatively be tuned by tilting to vary the optical thickness between faces 28, 30, or by application of an electric field to an electrooptic etalon material.

Wedge etalon 26 also acts as an interference filter, with non-parallel reflective faces 32, 34 providing tapered shape. Wedge etalon 26 may comprise a tapered transparent substrate, a tapered air gap between the reflective surfaces of adjacent transparent substrates, or a thin film "wedge interference filter as described further below. Wedge etalon 26 as shown in FIG. 1 is only one tunable element which may be used in accordance with the invention in an external cavity laser. Wedge etalon 26 may also be replaced with a variety of tunable elements other than an etalon, such as grating devices and electro-optic devices, as also discussed further below.

The relative size, shape and distances between the various optical components of external cavity laser 10 are in some instances exaggerated for clarity and are not necessarily shown to scale. External cavity laser 10 may include additional components (not shown), such as focusing and collimating components, and polarizing optics configured to remove spurious feedback associated with the various components of external cavity laser 10.

The pass bands defined by the wedge etalon 26 are substantially broader than the pass bands of the grid etalon 24, with the broader pass bands of the wedge etalon 26 a periodicity substantially corresponding to the separation between the shortest and longest wavelength channels defined by the grid etalon 24. In other words, the free spectral range of the wedge etalon 26 corresponds to the full wavelength range of the wavelength grid defined by grid etalon 24. The wedge etalon 26 has a finesse which suppresses channels adjacent to a particular selected channel.

The wedge etalon 26 is used to select between multiple communication channels by changing the optical thickness between faces 32, 34 of wedge etalon 26. This is achieved by translating or driving wedge etalon 26 along axis x, which is parallel to the direction of taper of wedge etalon 26 and perpendicular to optical path 22 and the optical axis of external cavity laser 10. Each of the pass bands defined by the wedge etalon 26 supports a selectable channel, and as the wedge is advanced or translated into optical path 22, the beam traveling along optical path 22 passes through increasingly thicker portions of wedge etalon 26 which support constructive interference between opposing faces 32, 34 at longer wavelength channels. As wedge etalon 26 is withdrawn from optical path 22, the beam will experience increasingly thinner portions of wedge etalon 26 and expose pass bands to the optical path 22 which support correspondingly shorter wavelength channels. The free spectral range of wedge etalon 26 corresponds to the complete wavelength range of grid etalon 24 as noted above, so that a single loss minimum within the communications band can be tuned across the wavelength grid. The combined feedback to gain medium 12 from the grid etalon 24 and wedge etalon 26 support lasing at the center wavelength of a selected channel. Across the tuning range, the free spectral range of the wedge etalon 26 is broader than that of grid etalon 24.

Wedge etalon 26 is positionally tuned via a tuning assembly which comprises a drive element 36 structured and configured to adjustably position wedge etalon 26 according to selected channels. Drive element 36 may comprise a stepper motor together with suitable hardware for precision translation of wedge etalon 26. Drive element may alternatively comprise various types of actuators, including, but not limited to, DC servomotors, solenoids, voice coil actuators, piezoelectric actuators, ultrasonic drivers, shape memory devices, and like linear actuators.

Drive element 36 is operatively coupled to a controller 38 which provides signals to control the positioning of wedge etalon 26 by drive element 36. Controller 38 may include a data processor and memory (not shown) wherein are stored lookup tables of positional information for wedge etalon 26 which correspond to selectable channel wavelengths. Controller 38 may be internal to driver element 36, or may be external and shared in other component positioning and servo functions of the invention as described below.

When external cavity laser 10 is tuned to a different communication channel, controller 38 signals drive element 36 according to positional data in the look up table, and drive element 36 translates or drives wedge etalon 26 to the correct position wherein the optical thickness of the portion of the wedge etalon 26 positioned in optical path 22 provides constructive interference which supports the selected channel. A linear encoder 40 may be used in association with wedge etalon 26 and drive element 36 to ensure correct positioning of wedge etalon 26 by driver 36.

Wedge etalon 26 may include opaque regions 42, 44 at its ends that are optically detectable and which serve to verify the position of wedge etalon 26 when it has been positionally tuned to its longest or shortest channel wavelength. Opaque regions 26 provide an additional encoder mechanism usable in the positional tuning of wedge etalon. When wedge 26 is moved into a position such that one of opaque regions 42, 44 enters optical path 22, the opaque region 42, 44 will block or attenuate the beam along optical path. This attenuation of light is detectable, as described further below. Since the location of opaque regions 42, 44 on wedge etalon 26 can be determined with precision, controller 38 can anticipate when an opaque region 42, 44 will enter optical path 22. Appearance of an opaque region 42, 4 in optical path 22 at a point other than predicted will indicate an encoder error, and the controller 38 can make an appropriate correction based on the detected presence of an opaque region 42, 44 in optical path 22. Additional opaque regions (not shown) may be included elsewhere on wedge etalon 26.

Figure 2A:
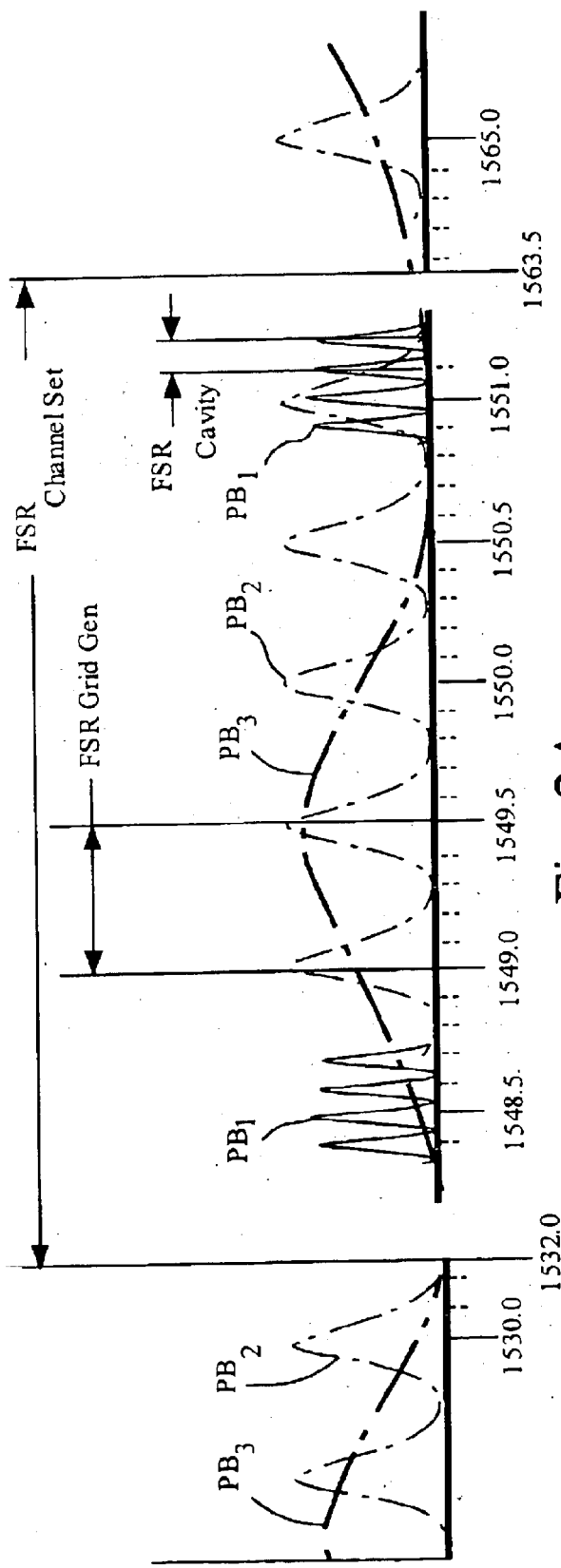
FIGS. 2A–2C are graphical illustrations of pass band characteristics of the external cavity laser of FIG. 1 for the wedge etalon, grid etalon and external cavity with respect to a selected channel in a wavelength grid.
Figure 2B:
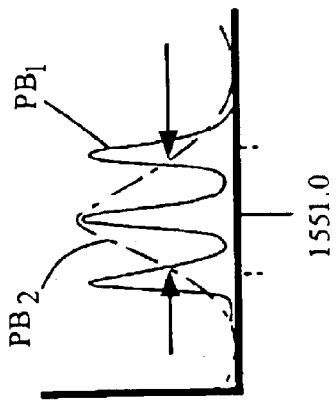
Figure 2C:
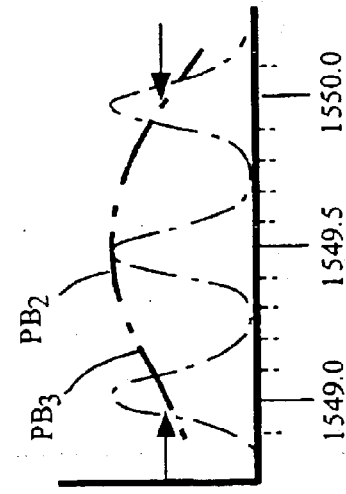

The pass band relationship of the grid etalon 24, wedge etalon 26 and the external cavity defined by rear facet 18 and end mirror 14 are illustrated graphically in FIG. 2A through FIG. 2C, which show external cavity pass bands PB1, grid etalon pass bands PB2, and wedge etalon pass bands PB3. Relative gain is shown on the vertical axis and wavelength on the horizontal axis. As can be seen, free spectral range of the wedge etalon 26 ($FSR_{Channel\ Sel}$) is greater than the free spectral range of the grid etalon 24 ($FSR_{Channel\ Sel}$), which in turn is greater than the free spectral range of the external cavity ($FSR_{Grid\ Gen}$). The band pass peaks PB1 of the external cavity periodically align with the center wavelengths of pass bands PB2 defined by the wavelength grid of grid etalon 24. There is one pass band peak PB3 from the wedge etalon 26 which extends over all of the pass bands PB2 of the wavelength grid. In the specific example shown in FIG. 2A-2C, the wavelength grid extends over sixty four channels spaced apart by one half nanometer (nm) or 62 GHz, with the shortest wavelength channel at 1532 nm, and the longest wavelength channel at 1563.5 nm.

The finesse of grid etalon 24 and wedge etalon 26 determine the attenuation of neighboring modes or channels. As noted above, finesse is equal to the free spectral range over the full width half maximum, or finesse=FSR/FWHM. The width for a grid etalon pass band PB2 at half maximum is shown in FIG. 2B, and the width for a wedge etalon pass band PB3 at half maximum is shown in FIG. 2C. The positioning of grid etalon 24 and wedge etalon 26 within the external cavity improves side mode suppression.

Figure 3A:
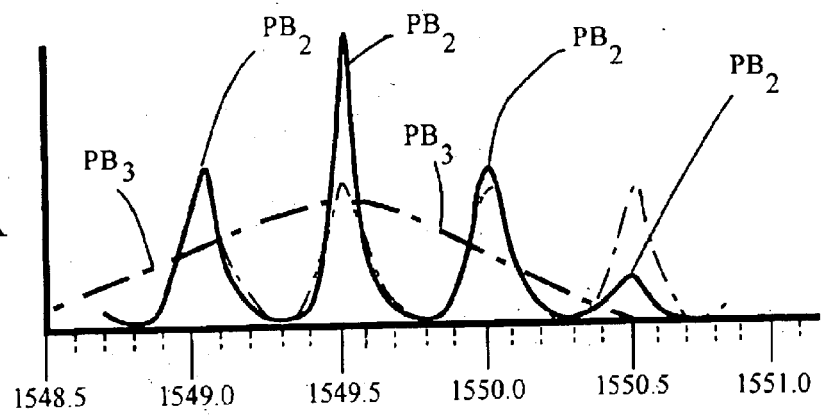
FIGS. 3A–3C are graphical illustrations of gain response to tuning of the external cavity laser of FIG. 1 for a plurality of channels in a wavelength grid.
Figure 3B:
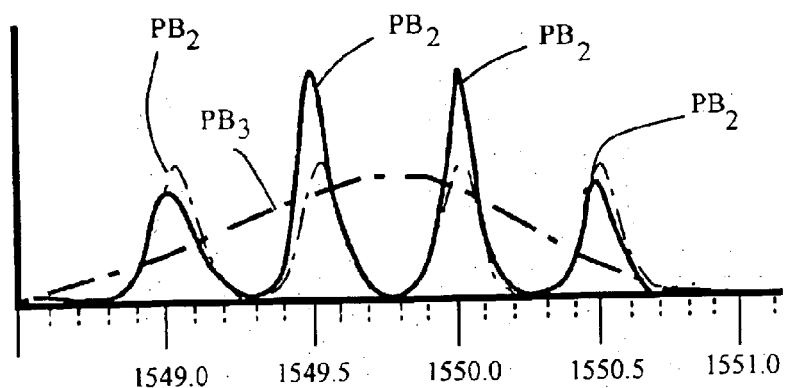
Figure 3C:
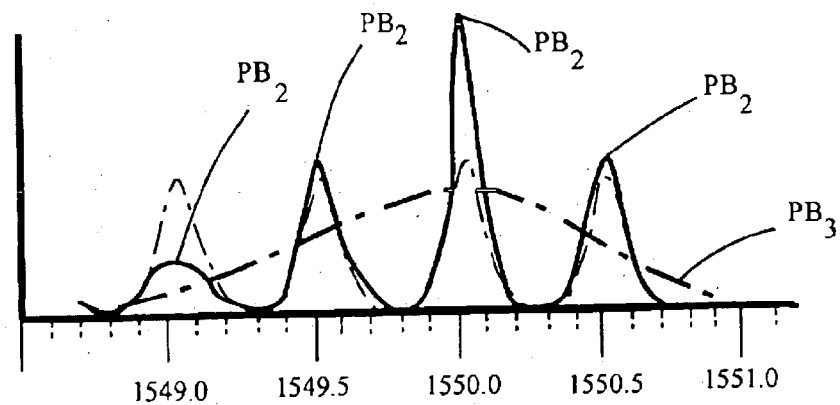

The tuning of the band pass PB3 of wedge etalon 26 between a channel centered at 1549.5 nm and an adjacent channel at 1550 nm is illustrated graphically in FIGS. 3A–3C, wherein the selection of a channel generated by grid etalon 24 and the attenuation of adjacent channels or modes is shown. The external cavity pass bands PB1 shown in FIGS. 2A–2C are omitted from FIGS. 3A–3C for clarity. The grid etalon 24 selects periodic longitudinal modes of the external cavity corresponding to the grid channel spacing while rejecting neighboring modes. The wedge etalon 26 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 3A, the wedge etalon pass band PB3 is centered with respect to the grid channel at 1549.5 nm. The relative gain associated with pass band PB2 at 1549.5 nm is high, while the relative gain levels associated with adjacent pass bands PB2 at 1549.0 nm and 1550.0 nm are suppressed relative to the selected 1549.5 nm channel. The gain associated with pass bands PB2 at 1550.5 nm and 1548.5 nm is further suppressed. The dashed line indicates the relative gain for pass bands PB2 without suppression by wedge etalon 26.

FIG. 3B shows the wedge etalon pass band PB at a position in between the channels at 1549.5 nm and 1550.0 nm, as occurs during channel switching. The relative gain associated with pass bands PB2 at 1549.5 nm and 1550.0 nm are both high, with neither channel suppressed. The relative gain levels associated with pass bands PB2 at 1549.0 nm and 1550.5 nm are suppressed relative to the 1549.5 nm and 1550.0 nm channels. The dashed line indicates the relative gain for pass bands PB2 without suppression by wedge etalon 26.

FIG. 3C shows the wedge etalon pass band PB3 centered with respect to the grid channel at 1550.0 nm, with the relative gain associated with the pass band PB2 at 1550.0 nm being high, while the relative gain levels associated with adjacent pass bands PB2 at 1549.5 nm and 1550.5 nm are suppressed relative to the selected 1550.0 nm channel, and the gain associated with pass bands PB2 at 1551.0 nm and 1549.0 nm is further suppressed. Again, the dashed line indicates the relative gain for pass bands PB2 without suppression by wedge etalon 26.

Figure 4:
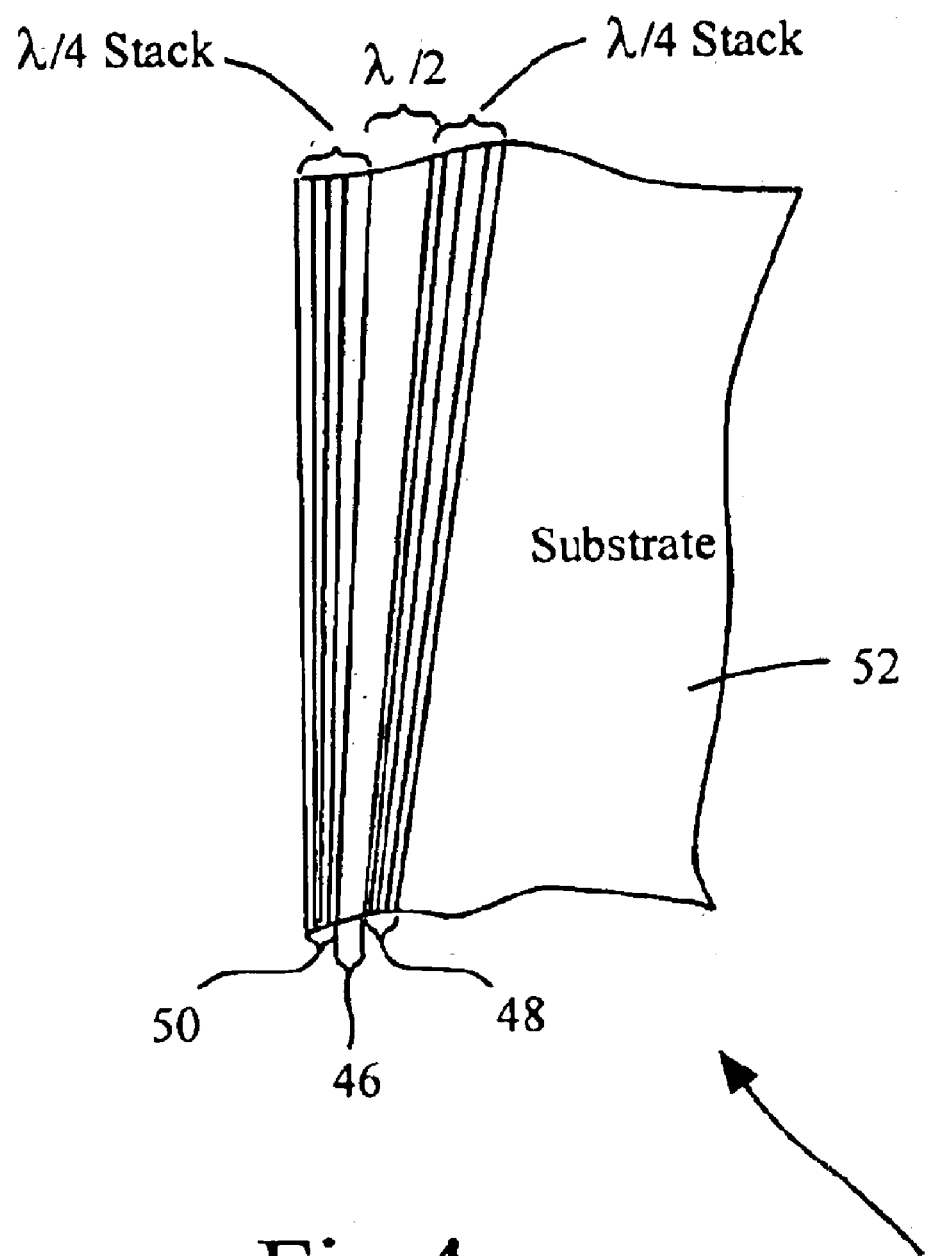
FIG. 4 is a schematic view in cross section of a wedge etalon usable with the present invention.

The need for greater bandwidth in telecommunications systems will require narrow channel spacing and, accordingly, more sophisticated tunable elements. FIG. 4 shows a wedge etalon 26 fabricated as a thin film device which comprises a single half wave ($\lambda/2$) layer 46 positioned between a pair of dielectric stacks 48, 50 of quarter wave ($\lambda/4$) layers. Half wave layer 46 and quarter wave stacks 48, 50 are formed by thin film deposition on the surface of a transparent substrate 52. Half wave layer 46 and quarter wave stacks 48, 50 are tapered in thickness in order to define a "wedge" shape. The actual "wedge" in this case is the half wave layer 46, with quarter wave stacks 48, 50 providing reflective or partially reflective surfaces therefore.

The relative thickness of layers 46, 48, 50 as shown in FIG. 4 are exaggerated for clarity, and the degree of taper is greatly exaggerated. Channel selection for external cavity laser 10 can be carried out within a tuning range of about 1530 nm to 1565 nm using the thin film wedge etalon of FIG. 4. As a specific example, wedge etalon 26 is about 18 millimeters long, and the thickness of half wave layer 46 is about 510 nm at the narrow end, and about 518 nm thick at the wide end of wedge etalon 26, so that half wave layer 46 is tapered in thickness by eight nanometers over a length of 18 millimeters. In general, wedge etalon 26 will need to define 100 different communication channels, and half wave layer 46 will provide 100 different transmission zones (not shown) corresponding to the 100 selectable channels. For an eighteen millimeter long wedge etalon 26 and a beam width of 360 microns, the individual zones will be separated by a distance of 180 microns. The coefficient of thermal expansion of the materials of the half wave layer 46, quarter wave layers 48, 50 and substrate 52 are selected to minimize dimensional fluctuation within a standard operating temperature range.

Figure 5A:
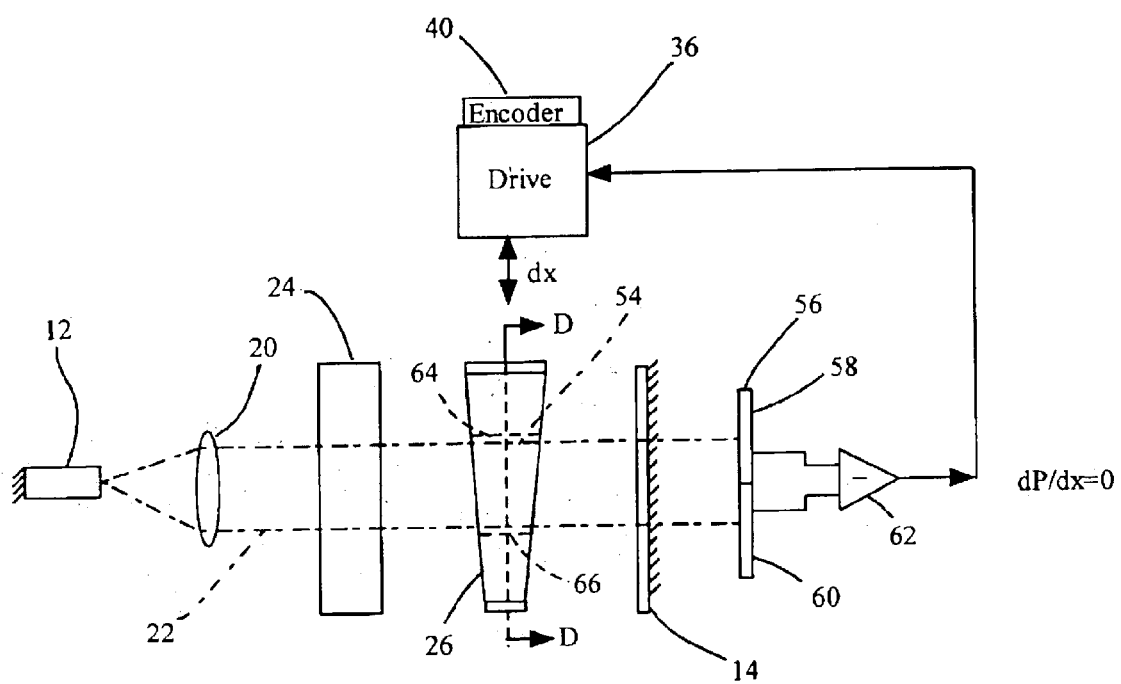
FIGS. 5A–5C are schematic illustrations of an error signal generation system in accordance with the present invention embodied in an external cavity laser, showing the positioning of a constructive interference fringe in the wedge etalon with respect to a coherent light beam.
Figure 5B:
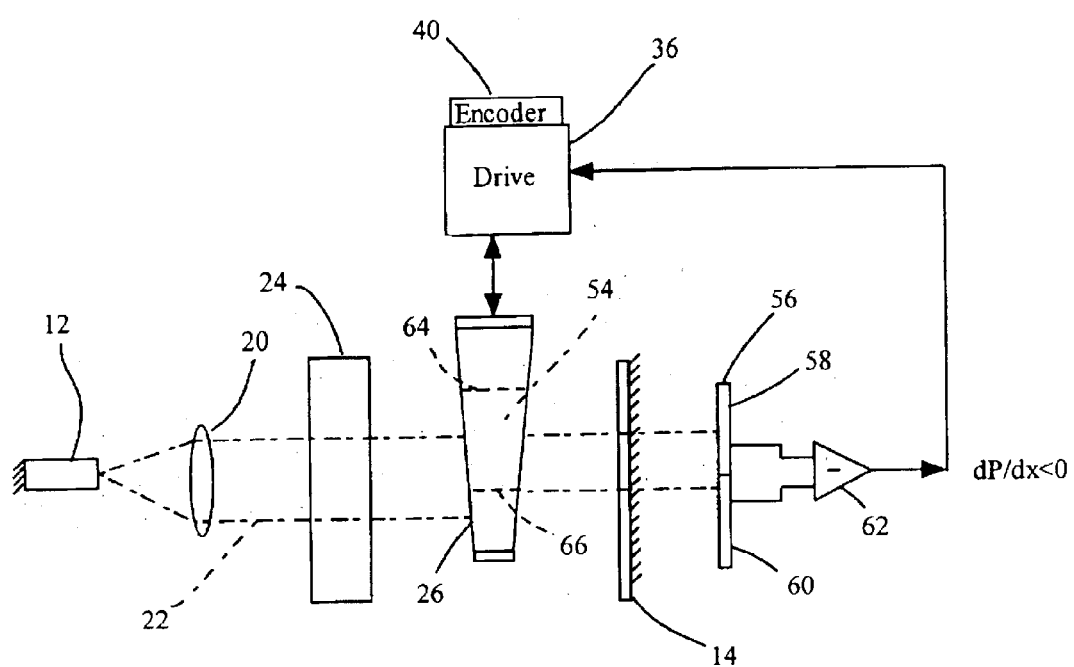
Figure 5C:
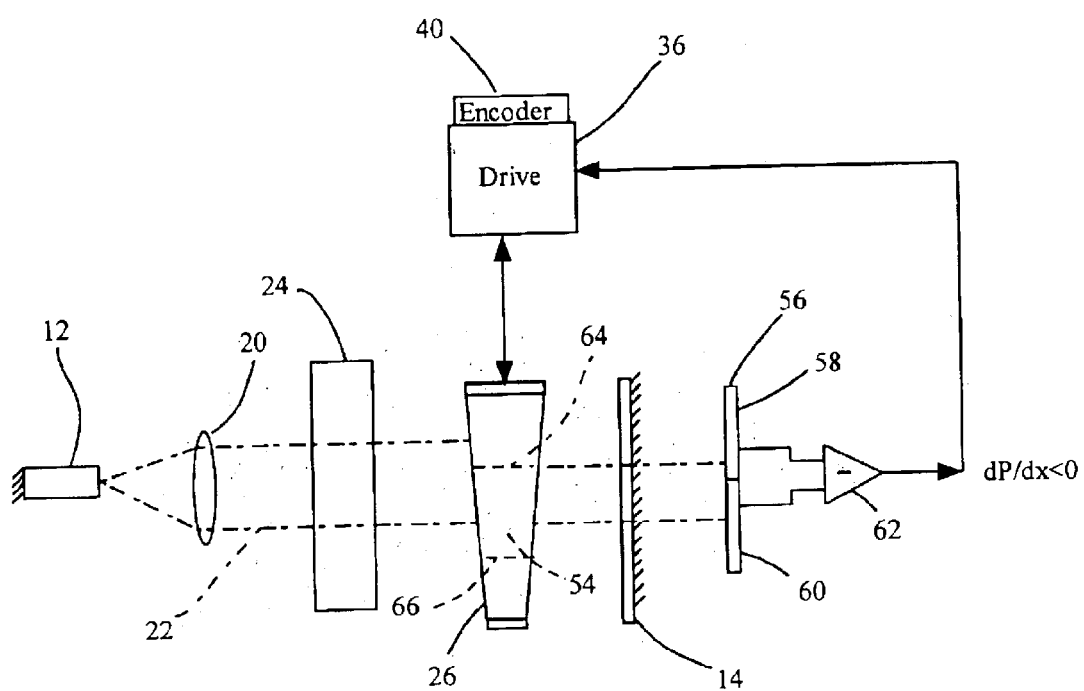

With the above in mind, reference is now made to FIG. 5A through FIG. 5C, which show an embodiment error signal generation system in accordance with the present invention as used with an external cavity laser apparatus of the type described above, with like reference numbers denoting like parts. When tuned to a selected channel, the external cavity laser will provide a coherent beam along optical path 22 at a fixed frequency or wavelength that corresponds to the selected channel. The wedge etalon 26 will define a constructive interference fringe for the coherent beam, which is shown in FIGS. 5A–5C as fringe 54. Ideally, fringe 54 must be centered in optical path 22, or the coherent beam passing through wedge etalon 26 along path 22 will be truncated and spatial losses will result. The error signal generation system of the invention maintains fringe 54 at the center of optical path 22 during operation of the external cavity laser and avoids such spatial losses. The error signal generation system of the invention also prevents unintended channel changing during operation by maintaining constructive interference fringe 54 in the center of optical path 22. Wedge etalon 26, as shown in FIGS. 5A–5C, may comprise a solid substrate with tapered reflective surfaces, an "air gap" etalon in which two adjacent substrates have tapered reflective surface that define an air gap etalon therebetween, or a thin film wedge etalon device as shown in FIG. 4.

The error signal generation and servo system of the invention includes a detector 56 which is configured or otherwise capable of generating an error signal indicative of spatial losses associated with the positioning of constructive interference fringe 54 in optical path 22. In the embodiment shown in FIGS. 5A–5C, detector 56 is a split detector which includes two equal halves 58, 60. Detector 56 could alternatively comprise a different multi-element detector, a plurality of suitably positioned separate detectors, a "lateral effect detector" or broad area detector wherein a voltage signal is generated that is proportional to the position of the centroid of an impinging light beam, or any other suitable detector.

End mirror 14 may be about ninety five percent reflective so that a small portion of the output from the external cavity reaches detector 56. The two halves 58, 60 of detector 56 are operatively coupled to a difference signal generator circuit 62, which in turn is operatively coupled to drive element 36. Split detector 56 and difference circuit 62, together with wedge etalon 26, provide an error signal generation system, which together driver 36 provide a servo system that maintains optimal positioning of fringe 54 and wedge etalon 26 according to error signals derived from split detector 56. The operation of the servoing of the wedge etalon 26 is described in more detail below.

Figure 5D:
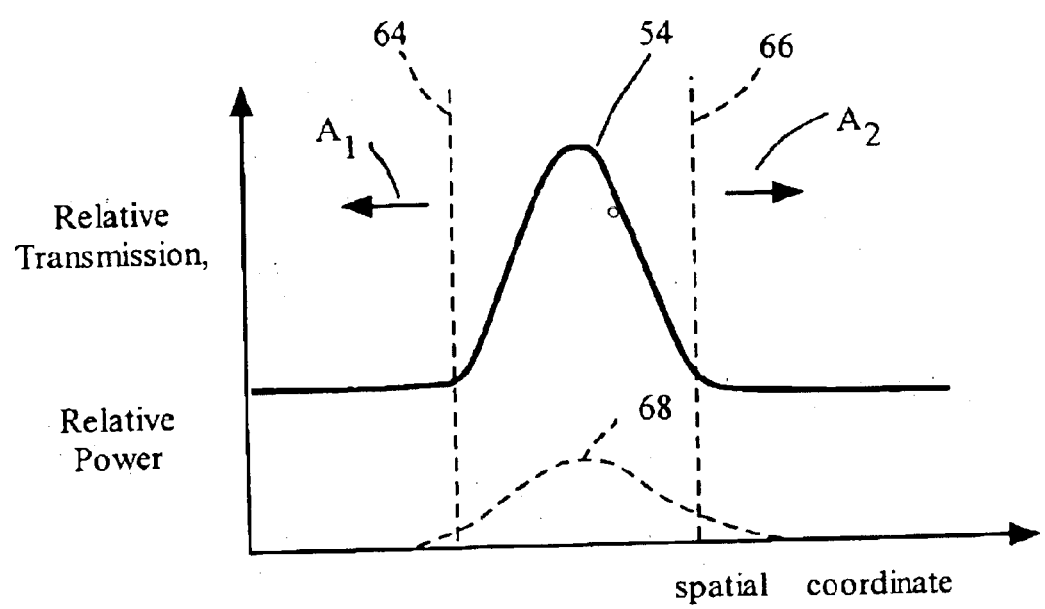
FIG. 5D is a graphical illustration of the position of the constructive interference fringe of the wedge etalon with respect to the Gaussian intensity distribution of the beam for the arrangement shown in FIG. 5A.

In FIG. 5A, wedge etalon 26 is shown as positioned with fringe 54 centered in optical path 22, such that optical path 22 is centered between the edges 64, 66 of fringe 54. FIG. 5D graphically illustrates fringe 54 as it would be seen through line D—D in wedge etalon 26, with fringe 54 shown as a solid line, and with relative transmission shown along the vertical axis and relative spatial coordinate x along the horizontal axis. Also shown in FIG. 5D as a dashed line 68 is the Gaussian intensity distribution for the coherent beam along optical path 22, with relative power represented on the vertical axis and spatial coordinate x on the horizontal axis.

Figure 6A:
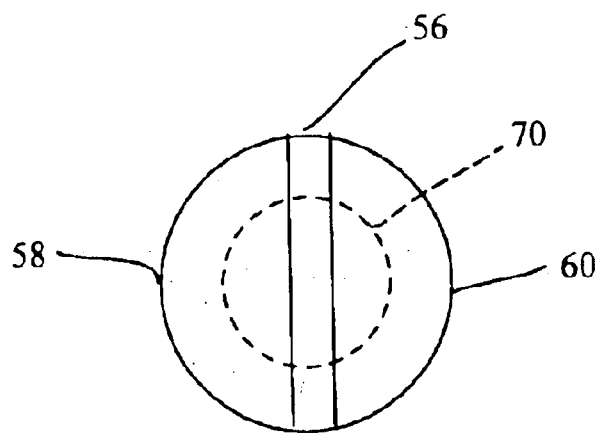
FIG. 6A through FIG. 6C schematically illustrate of the positioning of a beam spot on the split detector according to the wedge etalon positions shown in FIGS. 5A–5C.

FIG. 5A and FIG. 5D illustrate optimal positioning of the coherent beam along optical path 22 with respect to wedge 26, with spatial losses to the beam being nominally zero. FIG. 6A shows the result of this arrangement as a symmetrical beam spot 70 on detector 56, with equal portions of beam spot 70 positioned on each detector half 58, 60. With fringe 54 centered in optical path 22 as shown in FIG. 5A, the corresponding beam spot 70 (FIG. 6) of optical path 22 on split detector 46 will be centered, and the two halves 58, 60 of detector will receive an equal amount of optical power from beam spot 70.

Movement of wedge etalon 26 such that fringe 54 is not centered in optical path 22 will result in blockage of spatial portions of the coherent beam. Thus, movement of fringe 54 from its position as shown in FIG. 5D in the directions indicated by arrows A1 and A2 will result in spatial losses to the beam as it passes through wedge etalon 26. The dual detector halves or portions 58, 60 serve as spatially separate detectors which detect blockage of transmission associated with non-optimal positioning of wedge etalon 26. Such movement of wedge etalon 26 during operation of the external cavity laser may occur due to thermal fluctuations, external vibration, machining imperfections associated with the drive assembly 36, or other factors.

Figure 6B:
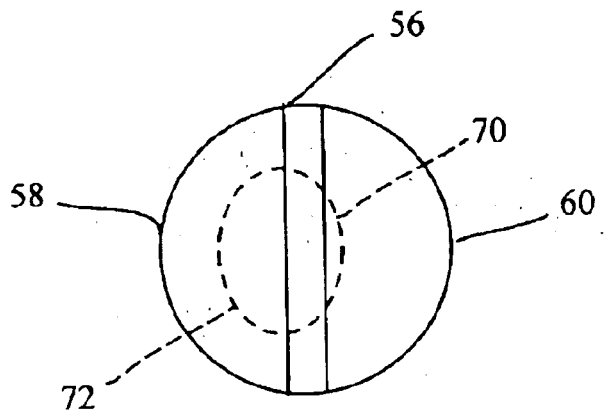
Figure 6C:
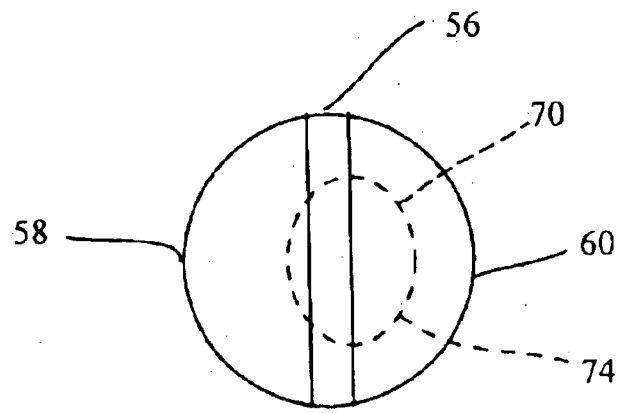

FIG. 5B shows wedge etalon 26 positioned such that fringe 54 is off-center with respect to optical path 22, such that the two halves 58, 60 of detector 56 receive non-equal amounts of optical power. FIG. 6B shows a beam spot 72 that is truncated due to fringe 54 being off-center such that a greater portion of beam spot 72 falls on detector half 58 than on detector half 60 according to the position of wedge etalon 26 in FIG. 5B. FIG. 5C shows wedge etalon 26 and fringe positioned off-center with respect to optical path 22 in the opposite direction from that shown in FIG. 5B, with FIG. 6C showing the resulting beam spot 74 on detector 56 being truncated and providing more optical power to detector half 60 than to detector half 58. The positioning of wedge 26 and fringe 54 as shown in FIG. 5B and FIG. 5C are non-optimal and require re-positioning of wedge etalon 26 to drive wedge etalon 26 to the zero error position shown in FIG. 5A.

Difference signal generator 62 is operatively coupled to each of the detector halves 58, 60 of detector 56, and generates an error signal from the voltage outputs of halves 58, 60 that indicates the change in optical power P received by detector halves 58, 60 with respect to wedge etalon 26 position x. The error signal may be in the form of a simple difference signal, a normalized difference signal, a spatial derivative $dP/dx$, or in other form of error signal. The error signal for FIGS. 5A–5C is discussed in terms of a spatial derivative signal $dP/dx$. The difference error signal is communicated to driver element 36, which translates or re-positions wedge etalon 26 so that fringe 54 is again centered in optical path 22. The position of wedge etalon 26 as shown in FIG. 5B leads to an error signal $dP/dx<0$, and results in translation of wedge etalon 26 so that a thicker portion of wedge etalon 26 is moved into optical path 22 to recenter fringe 54 in optical path 22. The position of wedge etalon 26 as shown in FIG. 5C provides an error signal $dP/dx>0$ and results in translation of wedge etalon 26 so that a thinner portion is moved into optical path 22. Wedge etalon 26 as shown in FIG. 5A will result in an error signal $dP/dx=0$, which does not require positional correction. The servoing of wedge etalon 26 in the above manner keeps the coherent beam along optical path 22 centered with respect to constructive interference fringe 54 and prevents spatial losses to the beam which would otherwise result in power output fluctuation from the external cavity laser.

Figure 5E:
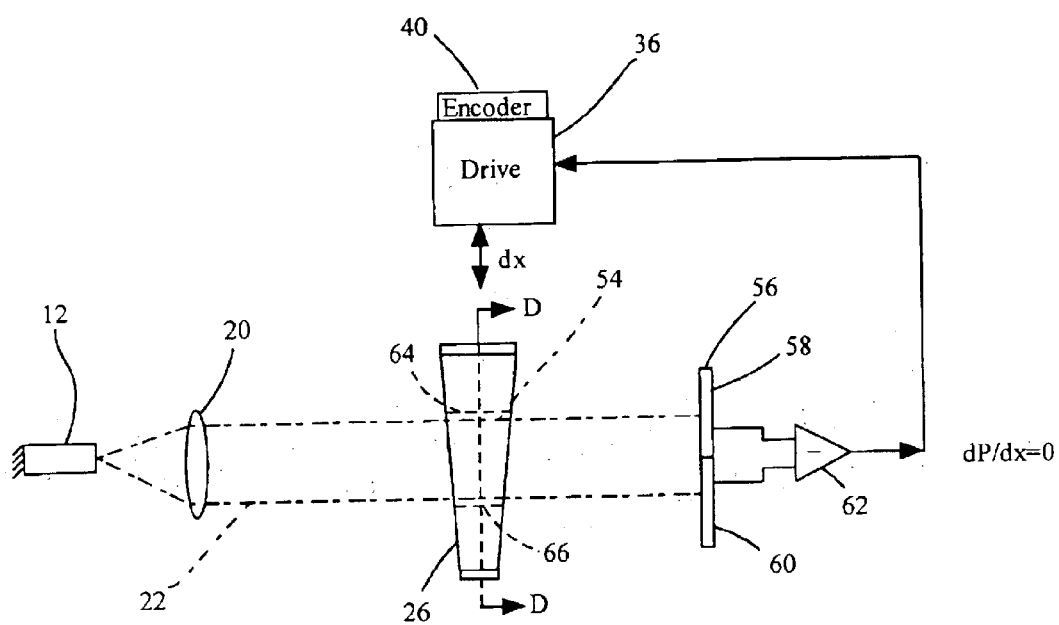
FIG. 5E is a schematic illustration of the error signal generation system of FIG. 5A–FIG. 5C shown without an external cavity laser.

FIG. 5E shows an error signal generation system in accordance with the invention without the external cavity laser features of FIGS. 5A–5C. In FIG. 5E, wedge etalon 26 is positioned in the optical path of the coherent beam emitted by gain medium 12, and detector 56 is positioned in optical path 22 after wedge etalon 26. Error signals associated with the position of constructive interference fringe 56 with respect to optical path 22, and are used to adjust the position of wedge etalon 26 via drive element 36 in the manner described above. The error signal generation system of the invention as shown in FIG. 5E is usable in any coherent optical systems. Detector 56 may be positioned for near field and far field uses. Wedge etalon 26 may be replaced with a parallel face etalon for some far field embodiments.

Figure 7:
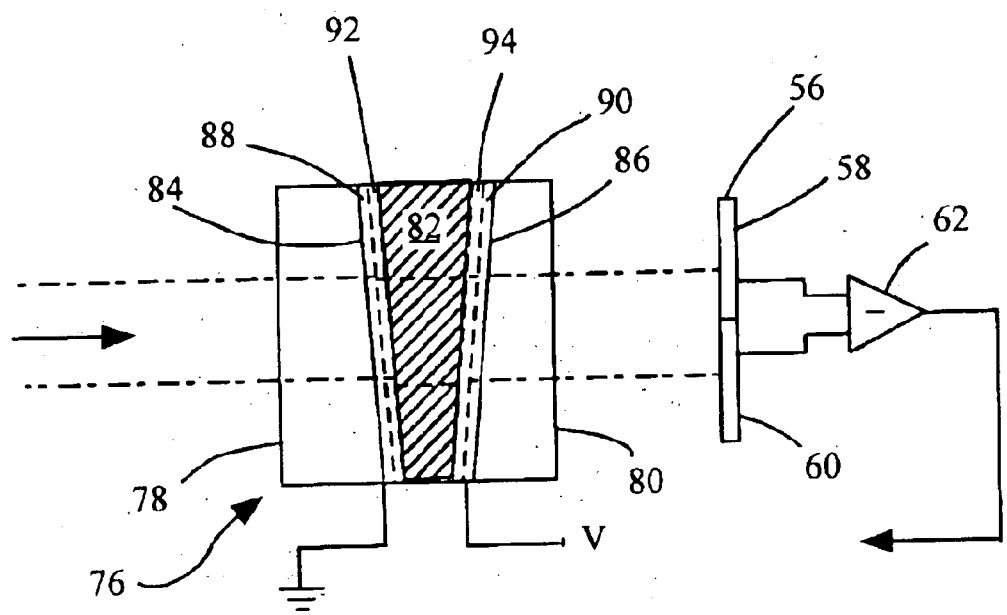
FIG. 7 is a schematic illustration of an error signal generation system in accordance with the invention using a tunable element based on an electro-optic material.

As noted above, various types of tunable elements may be used with the invention FIG. 7 shows an error signal generation system utilizing an electro-optic tunable element 76. Electro-optic tunable element 76 comprises a pair of transparent substrates 78, 80 with a substrate 82 of electro-optic liquid crystal (LC) material positioned therebetween.

Substrates 78, 80 include reflective surfaces 84, 86 respectively which may be tapered such that a wedge shape is imparted to LC substrate 82. Transparent electrodes 88, 90 are respectively positioned adjacent substrate surfaces 84, 86. Transparent electrodes 88, 90 may comprise, for example, an indium-tin oxide (ITO) conductor. Alignment layers 92, 94, which may comprise oriented or grooved polymer layers, are respectively positioned between LC substrate 82 and transparent electrodes 88, 90 respectively. Electrode 90 is coupled to an adjustable voltage source V, and electrode 88 is grounded. A coherent light beam passes through substrates 78, 80 and LC etalon 82 along optical path 22 and impinges on a detector 56 in the manner described above. The detector halves 58, 60 are operatively coupled to a difference error signal generator 62, which in turn is operatively coupled to adjustable voltage source V.

LC substrate 82 comprises a plurality of individual, birefringent liquid crystalline molecules (not shown) which can undergo orientation in response to voltage applied across etalon 82 by electrodes 88, 90. Liquid crystalline materials of this sort are well known in the art and are not described herein. The change in orientation of the liquid crystalline molecules changes the refractive index of the bulk LC material, and hence the effective optical thickness path length through LC substrate 82. Thus, voltage applied across transparent electrodes 88, 90 will vary the effective optical path length experienced by the coherent beam as it passes through LC substrate 82 along optical path 22. Varying the voltage across LC substrate 82 changes the effective optical path length of the coherent beam along optical path 22 as it passes through electro-optic tunable element 76.

LC substrate 82 may be tapered in shape as shown such that it defines a constructive interference fringe (not shown) for the wavelength of the coherent light beam passing through LC etalon along optical path 22. Varying the voltage across LC substrate 82 serves to re-position the constructive interference fringe defined by LC substrate 82, and voltage regulation thus serves basically the same effect achieved by physically translating the wedge etalon as described above in reference to FIGS. 5A–5C. The relative sizes and thicknesses of the different components of electro-optic tunable element 76, and the angle of taper, are exaggerated for clarity in FIG. 7.

The dual detector halves 58, 60 serve as spatially separate detectors which detect blockage of transmission associated with non-optimal positioning of the interference fringe associated with LC substrate 82. When the constructive interference fringe defined by LC substrate 82 is non-centered with respect to the coherent beam along optical path 22, the beam will experience spatial losses and the beam spot on detector 56 will be truncated such that detector halves 58, 60 receive unequal portions of optical power. Difference signal generator 62 generates an error signal from the voltage outputs of halves 58, 60 that indicates the change in optical power received by detector halves 58, 60 due to spatial losses associated with position of the constructive interference fringe defined by LC etalon 82. The error signal, which may be in the form of a difference signal, is communicated to adjustable voltage source V, which controls the potential applied across transparent electrodes 88, 90 to keep the constructive interference fringe centered in optical path 22. Thus, in this embodiment of the invention, the voltage applied across the LC substrate 82 is adjusted in response to error signals derived from split detector 56.

The electro-optic tunable element 76 as shown in FIG. 7 may be implemented in an external cavity laser apparatus of the type shown in FIG. 1 by replacing the wedge etalon 26 with electro-optic tunable element 76 and replacing the drive element 36 with a suitable voltage source.

Figure 8:
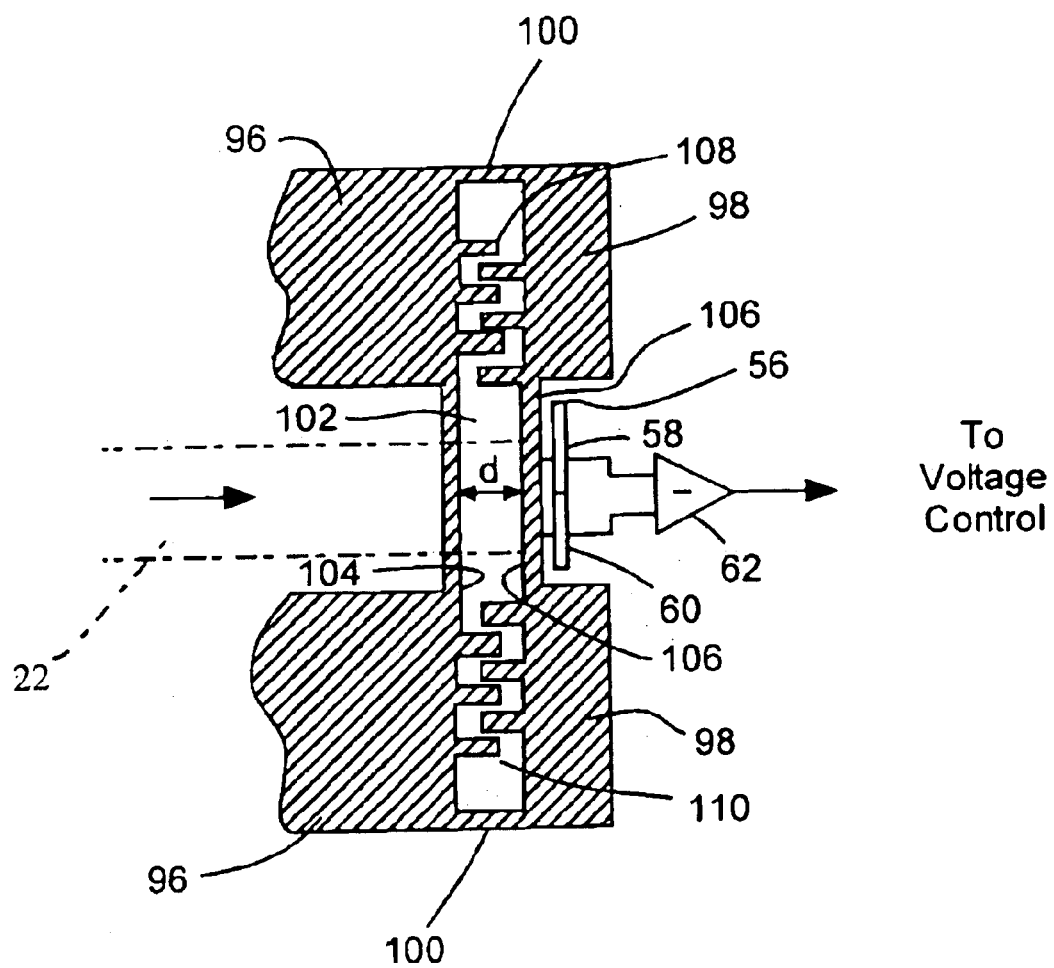
FIG. 8 is a schematic illustration of an error signal generation system in accordance with the invention embodied in a MEMS air gap etalon device.

Referring now to FIG. 8, an error signal generation system in accordance with the invention is shown embodied in a micro-electrical-mechanical system MEMS device. A substrate 96 includes an end section or portion 98 associated by hinge sections 100. Substrate 96 and end section 98 can be fabricated from the same bulk piece of semiconductor material via conventional ion etching, deposition and other conventional solid state fabrication techniques. The semiconductor material may comprise Si, GaAs, or any other semiconductor material which is amenable to MEMS fabrication techniques.

An air gap 102 is defined between substrate 96 and end portion 98, with reflective surfaces 104, 106 positioned adjacent air gap 102 and respectively associated with substrate 96 and end portion 98. End portion 98 is movable with respect to substrate 96 so that reflective surface 106 is movable with respect to reflective surface 104, and movement of end portion 98 controls the optical thickness d of air gap 102. Substrate 96 and end portion 98 include groups 108, 110 of interleaved electrodes on each side of air gap 102, with alternating ones of the interleaved electrodes respectively associated with the substrate 96 and end portion 98. Suitable application of voltage to selected electrodes of one or both electrode groups results in movement of end portion 98 with respect to substrate 96 by causing end portion 98 to flex or bow on hinge sections 100. The flexing motion serves to change the distance between reflective surfaces 104, 106, and hence alters the optical thickness d across air gap 102. Selected electrodes are operatively coupled to an adjustable voltage source (not shown), which in turn is operatively coupled to difference signal generator 62. The selected electrodes to which voltage is applied may be associated with the end portion 98 or the substrate 96, or both.

A coherent beam travels along optical path 22 and passes through reflective surfaces 104, 106 and impinges on detector 56. Detector 56 includes halves 58, 60 that are operatively coupled to a difference signal generator circuit 62. Air gap 102 serves as an etalon having a voltage controllable optical thickness. Air gap 102 defines a constructive interference fringe (not shown) for the coherent beam traveling optical path 22, and voltage controlled positioning of end portion 98 with respect to substrate 96 allows the position of the constructive interference fringe to be adjusted according to error signals from difference signal generator 62 and detector 56. When the constructive interference fringe defined by air gap etalon 102 is non-centered, spatial losses to the coherent beam traveling optical path 22 are detected by detector 56 in the manner described above. Difference signal generator 62 generates an error signal from the voltage outputs of halves 58, 60 indicative of the change in optical power received by detector halves 58, 60 due to spatial losses to the beam, and the thickness of air gap etalon 102 is re-positioned to keep the constructive fringe centered in the beam.

Since substrate 96 and end portion 98 are derived from the same bulk semiconductor material, it is possible to provide various optical components together with substrate 96 and end portion 98 which are integral to substrate 96 or end portion. For example, a semiconductor laser device (not shown), prepared by conventional etching and deposition techniques, may be integral to substrate 96 to provide the coherent beam along optical path 22. A grid etalon and end reflector (also not shown may be formed as portions of semiconductor material which are integral to substrate 99. Detector 56 may be formed as a thin film device which is integral to substrate 96 and suitably positioned with respect to air gap 102. Thus, it is contemplated that an external cavity laser, together with the error signal generation system of the invention, may be embodied in a MEMS device fabricated from a single bulk semiconductor substrate.

The tunable element of the invention may be embodied in a variety of air gap etalon devices that are tunable by varying the optical path across the air gap according to various tuning mechanisms. For example, the tunable element may comprise an air gap etalon defined by separated, reflective surfaces which are positionally controlled via a piezoelectric element. Voltage applied to the pieozoelectric element allows the separation of the reflective surfaces of the air gap according to an error signal. In another embodiment, a solid (single substrate) wedge etalon with reflective surface may be subject to thermal control for tuning the optical path length across the etalon according to an error signal derived from a split detector. The tunable element may also comprise an air gap etalon wherein one substrate is positioned relative to a fixed substrate via mechanical, thermal or electrically driven movement Referring next to FIG. 9A, the use of the invention with a retroreflective tunable element in the form of a diffraction grating 112 is shown. Grating 112 is chirped, and includes a first end 114 having a wider grating spacing, and a second end 116 with a narrower grating spacing. Grating 112 is positioned in the optical path 22 defined by a coherent beam which may be derived from an emitter chip or other coherent light source (not shown). Grating 112 is partially transmissive, and a split detector 56 is positioned behind grating 112 in optical path 22 as shown. Split detector 56 could alternatively be positioned to detect reflectance or diffraction from grating 112. A difference signal generator 62 is operatively coupled to detector halves 58, 60, and a drive or tuning assembly 36 is operatively coupled to difference signal generator 62. Drive assembly 36 is also operatively coupled to grating 112 and is configured to adjust the angular position of grating 112 with respect to optical path 22 by rotating grating 112 with respect to a pivot point 117.

The spacing of grating element 112 defines a constructive interference fringe (not shown) for the coherent beam diffracted off grating 112. The location of the constructive interference fringe with respect to optical path 22 is adjustable by positioning the angle of grating 112 with respect to optical path 22. As shown, grating is positioned with the constructive interference fringe centered in optical path 22. The spatial intensity profile of the coherent beam traveling optical path 22 is Gaussian in distribution as shown in FIG. 5D, and the primary component or portion of the beam will ideally be retroreflected by the grating 1 12 back along optical path 22 towards the coherent light source.

Figure 9A:
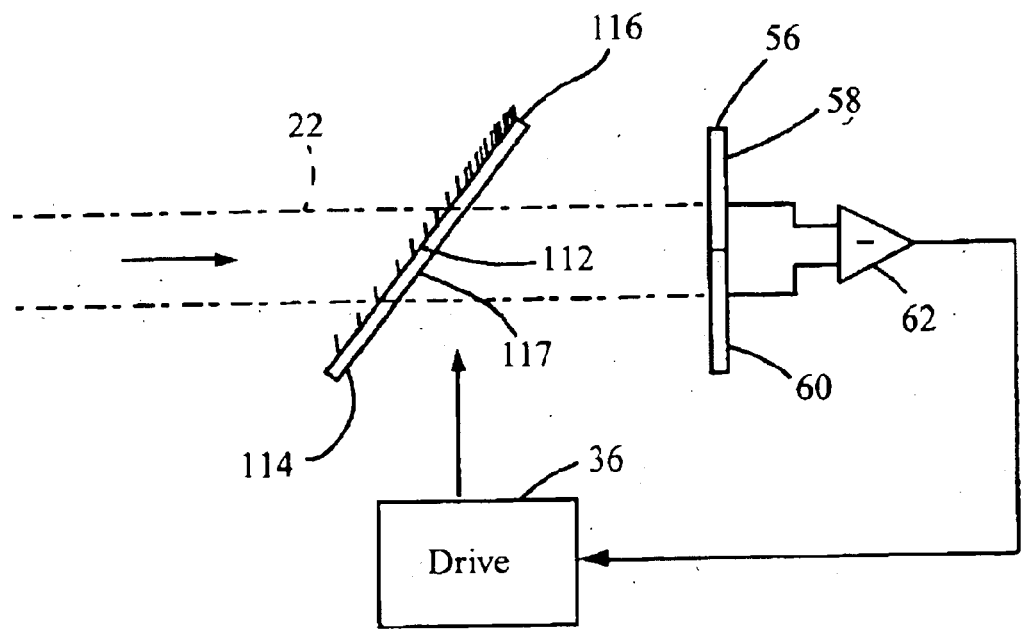
FIG. 9A is a schematic illustration of an error signal generation system in accordance with the invention using a chirped grating for a tunable element with a split detector positioned for nearfield detection.
Figure 9B:
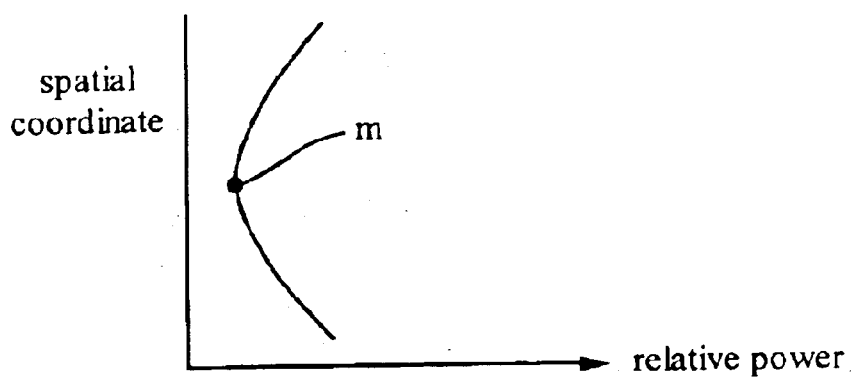
FIG. 9B is a graphical representation of optical power received by the split detector of FIG. 9A.

FIG. 9B graphically illustrates the relative optical power reaching split detector 56 for an optimally positioned grating 112 in FIG. 9A, with relative power shown on the horizontal axis, and relative spatial location along the vertical axis. A minimum in the light transmitted through grating 112 occurs at point M, which corresponds to the location on grating 112 of maximum retroreflection of the beam. Thus, less optical power is transmitted through grating 112 in the center of optical path 22 due to retroreflection of the beam center, while greater optical power is transmitted through grating towards the edges of optical path 22. When the constructive interference fringe defined by grating 112 is centered in optical path 22, the minimum M will be centered on detector 56 such that halves 58, 60 receive equal amounts of optical power. If the constructive interference fringe defined by grating 112 is not centered, spatial loss to the retroreflected portion of the beam occurs, and unequal amounts of optical power will reach split detector 56. This will give rise to an error signal from signal generator 62 in the manner described above, and the error signal is communicated to drive assembly 36, which adjusts the angular position of grating 112 with respect to optical path 22 to recenter the constructive interference fringe in optical path 22.

The error signal generation and servo system of FIG. 9A, like the wedge etalon embodiments described above, may be embodied in a continuously tunable external cavity laser. In such cases, grating 112 may be positioned within an external cavity defined by an end mirror and gain medium facet (not shown) as described above. A grid etalon (not shown) would be included in association with the external cavity for mode locking. The external cavity laser may be in a Littrow or an Litman-Metcalf configuration. The use of gratings as tunable elements for channel selection in external cavity lasers is well known and is not described herein.

Figure 10:
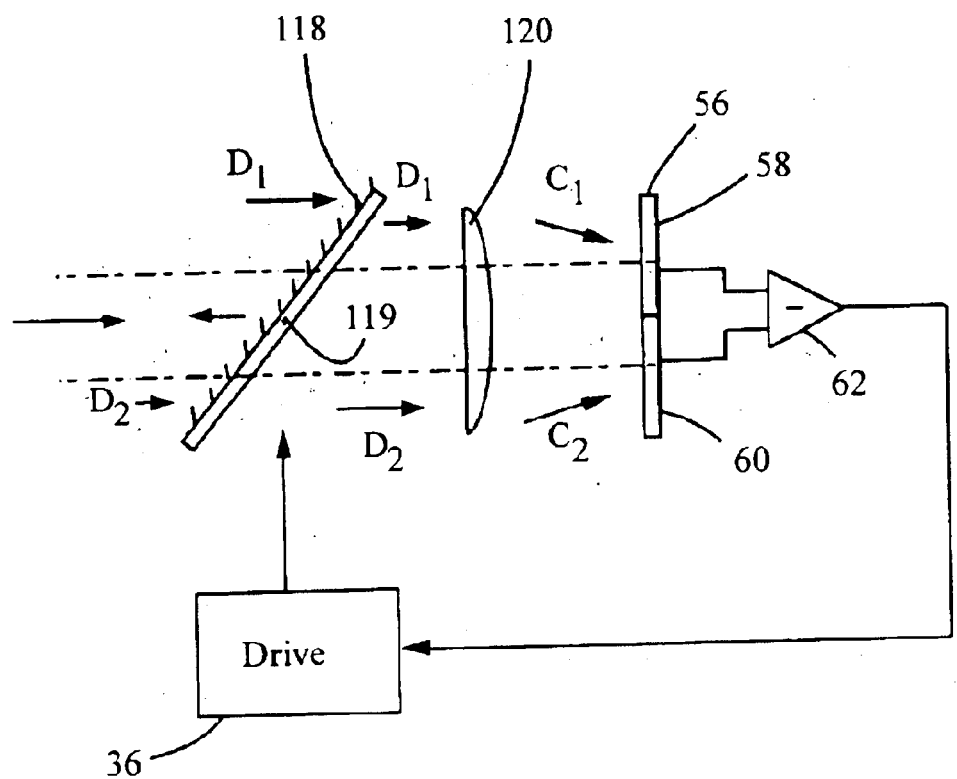
FIG. 10 is a schematic illustration of an error signal generation system in accordance with the invention using an unchirped grating as a tunable element and with the split detector positioned for far field detection.

The error signal generation system as shown in FIG. 9A is configured for near field positioning of detector 56 with respect to grating 112. In certain embodiments of the invention a far field arrangement may be used. FIG. 10 shows a far field embodiment of the invention utilizing an unchirped grating 118 as a tunable element. Grating 118 is positioned in an optical path 22 defined by a coherent light beam emitted from a coherent light source (not shown). The coherent light beam as a Gaussian angular distribution such that the main portion or component of the beam traveling along optical path 22 will be co-linear with optical path 22, but the outermost portions of the beam, as illustrated by arrows D1, D2, will be divergent with respect to optical path 22.

The grating 118 as shown in FIG. 10 is configured and positioned to retroreflect the main portion of the beam traveling optical path 22. Grating 118 is partially transparent, and where the beam along optical path 22 is retroreflected by grating 118, minimal transmission occurs through the grating 118. The outer, divergent portions of the beam are less fully retroreflected, and transmission of these portions of the beam through grating 118 occurs. This arrangement results in an optical power distribution at split detector 56 which is similar to that shown in FIG. 9B and described above. Because of the far field positioning of grating 118 and detector however, a collimating of lens 120 or other collimating optics are included and positioned between grating 118 and detector 56. Lens 120 collimates the divergent portions D1, D2 of the coherent beam traveling optical path to provide convergent or collimated portions C1, C2 which are directed to detector 56. If detector 56 is sufficiently distant from grating 118, collimating lens 120 may be omitted.

The spacing of grating 118 defines a constructive interference fringe (not shown) for the coherent beam diffracted off grating 118 in the manner described above, and the location of the constructive interference fringe with respect to optical path 22 is adjustable by positioning the angle of grating 118 with respect to optical path 22. When the constructive interference fringe defined by grating 118 is centered in optical path 22, detector 56 halves 58, 60 receive equal amounts of optical power. If the constructive interference fringe defined by grating 118 is not centered, spatial loss to the retroreflected portion of the beam occurs, and unequal amounts of optical power will reach split detector 56 to give rise to an error signal which is communicated to drive assembly 36. Drive assembly 36 accordingly adjusts the angular position of grating 118 with respect to optical path 22 by rotating grating 118 with respect to pivot point 119 to re-center the constructive interference fringe in optical path 22 as related above. The far field arrangement of the error signal generation and servo system of the invention may also be embodied in an external cavity laser apparatus.

Figure 11:
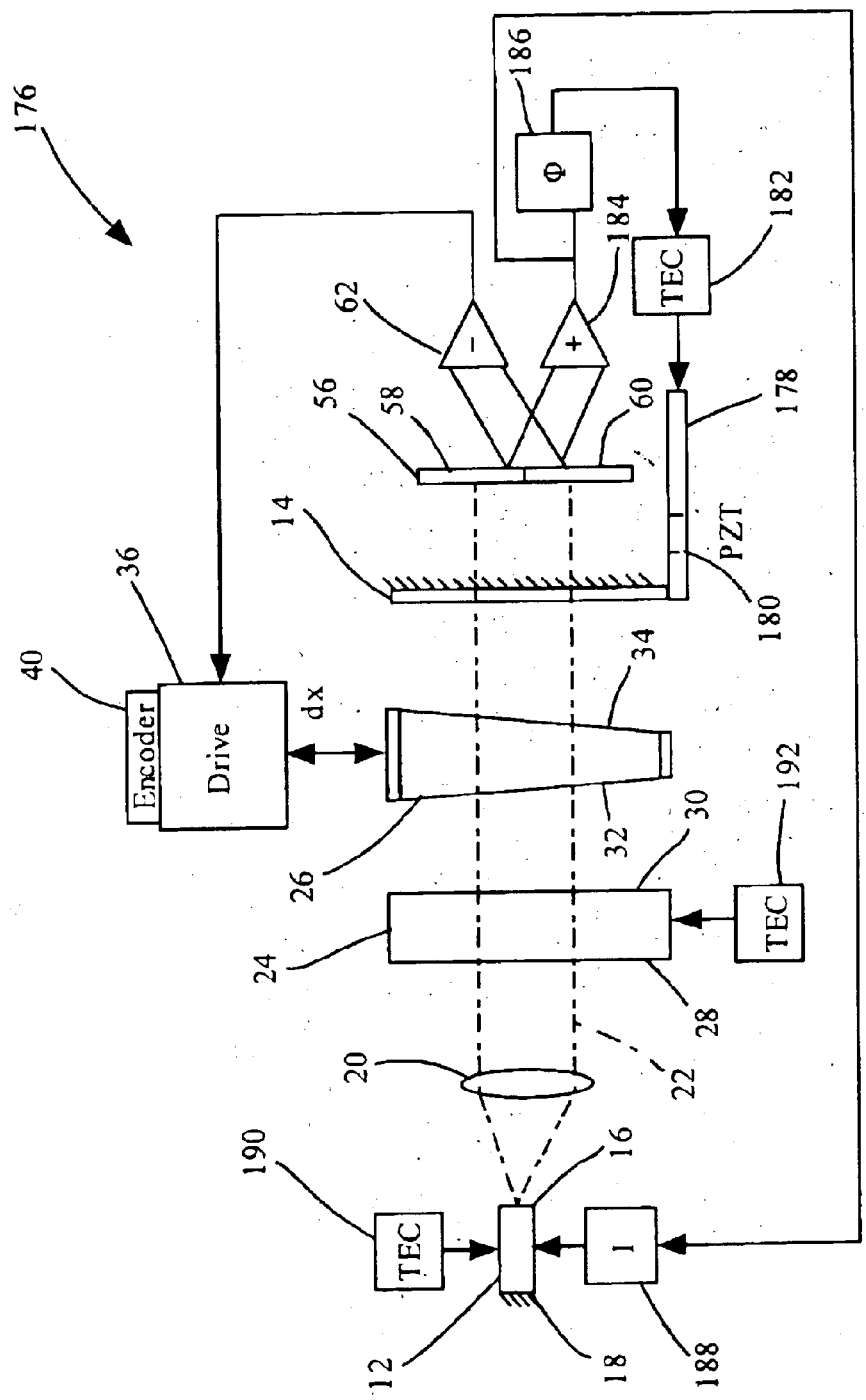
FIG. 11 is a schematic diagram of an external cavity laser using the error signal generation system of the invention.

The use of a split detector or other multi-element or lateral effect detector with an external cavity laser allows various other components of the external cavity laser to be adjusted or controlled according to error signals derived from the split detector. Referring to FIG. 11, there is shown an external cavity laser 176, with like reference numbers used to denote like parts. In the apparatus 176, the gain medium 12, grid etalon 24 and end mirror 14, as well as wedge etalon 26, are each separately adjusted according to error signals from split detector 56.

End mirror 14 is coupled to a tuning assembly which, as shown in FIG. 11, comprises an arm 178 coupled to end mirror 14, a piezoelectric oscillator element 180 operatively coupled arm 178, and a thermoelectric control module 182 is operatively coupled to arm 178. Ann 178 is made from a material having a high coefficient of thermal expansion, such as aluminum or other metal or metal alloy. A sum signal generator 184 is operatively coupled to detector halves 58, 60, and is operatively coupled to thermoelectric control module 182 through a phase lead compensator 186. Piezoelectric element 180 provides a periodic oscillation to the position of end mirror 14. The degree or amplitude of the oscillation of end mirror 14 is small, on the order of about 1 GHz, and at an oscillation frequency of about 20 KHz.

The small oscillation of end mirror 14 by oscillator 180 creates a detectable modulation in the amplitude of the optical power received by split detector 56 which is monitored or tracked in order to adjust the position of end mirror 14. A sum error signal is generated by signal generator 184, phase corrected by phase compensator 186, and communicated to thermoelectric controller 182 which, if needed, translates end mirror 14 by thermal control (heating or cooling) of aluminum arm 178 to maintain end mirror 14 in its optimal position. Positional adjustment of end mirror 14 in this manner serves to lock the overall cavity length of external cavity laser 176 to the grid etalon 24 at the same time that wedge etalon 24 is positioned by driver 36 to keep wedge etalon 26 locked to grid etalon 24.

The drive current of the gain medium emitter chip 12 in external cavity laser 176 is adjusted according to error signals from sum signal generator 184 to control the output wavelength of gain medium 12. A drive current controller 188 is operatively coupled to gain medium 12 and to sum signal generator 184. The sum signal derived from split detector 56 is communicated to drive current controller 188, which, if needed, adjusts the drive current to the gain medium 12. A thermoelectric controller 190 is operatively coupled to gain medium 12 to control its temperature according to a thermistor (not shown). A thermoelectric controller 192 is also used in association with grid etalon 24, with a thermistor (not shown) providing temperature feedback to controller 192 which responsively controls the optical thickness between faces 28, 30 of grid etalon 24 via temperature adjustment.

In the operation of external cavity laser 176, the wedge etalon 26 is adjusted with respect to the coherent beam along optical path 22 according to difference error signals derived from split detector 56 to keep the interference fringe (not shown) centrally positioned in optical path 22 to prevent spatial losses to the beam traveling optical path 22. The external cavity length is servoed to the grid etalon 24 by positional adjustment of end mirror 14 according to phase adjusted sum signals derived from split detector 56, to keep the external cavity locked to the grid etalon 24. The gain medium 12 drive current is adjustably controlled according to sum signals from split detector 56. Finally, the optical thickness of grid etalon 24 is thermally controlled by thermoelectric controllers 90.

Figure 12:
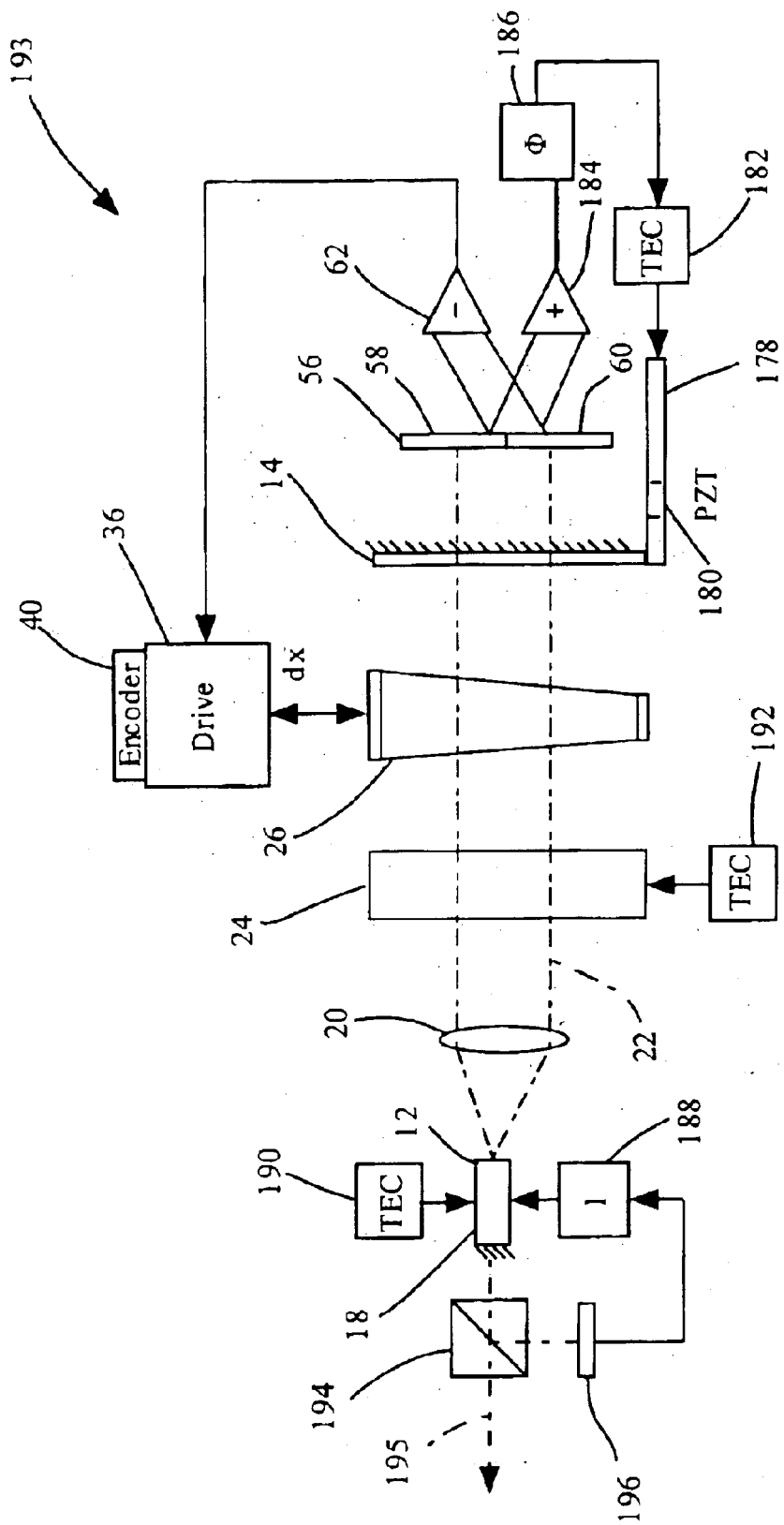
FIG. 12 is a schematic diagram of an alternative embodiment external cavity laser using the error signal generation system of the invention.

Since grid etalon 24, wedge etalon 26 and end mirror 14 are all positioned between detector 56 between gain medium 12 and detector 56, optical losses associated with the grid etalon, wedge etalon and end mirror 14 may potentially interfere with deriving an effective error signal for controlling the drive current to gain medium 12. It may thus be desirable in some instances to maintain the adjustment of drive current to gain medium 12 independently from detector 56 by using a separate detector positioned in closer proximity to gain medium 12. FIG. 12 shows an external cavity laser apparatus 193 in accordance with the invention wherein a beam splitter 194 is positioned in the output path 195 from emission facet 18 of gain medium. A portion of the output from emission facet 18 is directed by beam splitter 194 to a detector 196 which is operatively coupled to drive current controller 188. In this embodiment drive current controller 188 is responsive to the output of detector 196 instead of the summed output of split detector 56 as shown above for the apparatus 176. The output from emission facet 18 which is not directed to detector 196 is coupled into an optical fiber (not shown) in a conventional manner. In other respects, the external cavity laser apparatus 193 operates in the same manner described above for external cavity laser 176.

Figure 13:
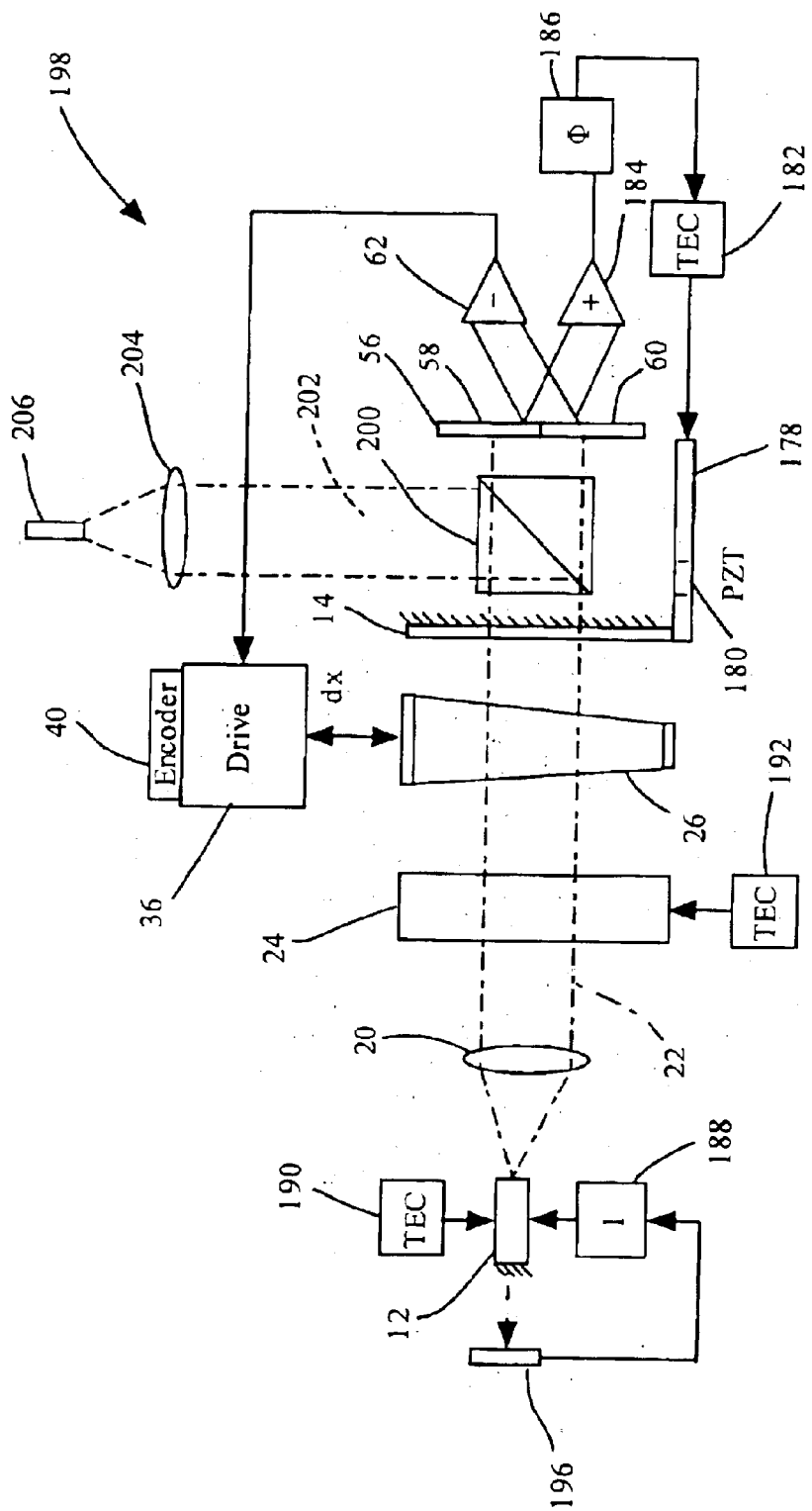
FIG. 13 is a schematic diagram of another alternative embodiment external cavity laser using the error signal generation system of the invention.

FIG. 13 shows another embodiment of an external cavity laser apparatus 198. In the apparatus 198, detector 196 is placed directly in front of emission facet 18, which has relatively high reflectivity. Drive current controller 188 operates to control the drive current to the gain medium 12 according to feedback from detector 196. A beam splitter 200 is positioned in optical path 22 to create an output path 202 which is focused by lens 204 and coupled into a fiber 206. Various other arrangements for external cavity lasers 176, 193 and 198 are possible using conventional optical components, and such arrangements will suggest themselves to those skilled in the art upon review of this disclosure. The invention may be embodied in lasers 176, 193 and 198 using a different tunable element, such as a grating element, in the manner described above.

The error signal generation and servo system provided by the invention may also be used to control the spontaneous emission glow associated with the output of an external cavity laser or other coherent light source. In this regard, a wedge etalon 26 or other tunable element is positioned in the output path from the external cavity laser before the output coupler to the fiber, with wedge etalon 26 serving basically as a tunable narrow band filter.

What is claimed is:

1. A system, comprising:
   a gain medium to emit an optical beam along an optical path;
   a reflective element positioned in the optical path to feedback a first portion of the optical beam to the gain medium;
   a tunable element positioned in the optical path to receive the optical beam and to select a lasing frequency of the gain medium, the tunable element further to diffract the optical beam to generate a constructive interference fringe; and a first optical detector positioned to receive the optical beam and the constructive interference fringe, the first optical detector to generate a first error signal in response the constructive interference fringe.

2. The system of claim 1 wherein the first optical detector is to generate the first error signal in response to a location of the constructive interference fringe impingent on the first optical detector.

3. The system of claim 2 wherein the location of the constructive interference fringe is dependent upon a tuning characteristic of the tunable element, wherein adjusting the tuning characteristic changes the lasing frequency of the gain medium.

4. The system of claim 3, further comprising a first tuning assembly operatively coupled to the tunable element, the first tuning assembly to adjust the tuning characteristic of the tunable element in response to the first error signal.

5. The system of claim 4 wherein the first optical detector comprises a split optical detector having two halves.

6. The system of claim 5 wherein the split optical detector further includes a difference signal generator circuit to generate the first error signal based upon amounts of optical power impingent upon each of the two halves.

7. The system of claim 6, wherein the split optical detector further includes a sum signal generator circuit to generate a second error signal.

8. The system of claim 7, further comprising a second tuning assembly operatively coupled to the reflective element, the second tuning assembly to positionally adjust the reflective element in response to the second error signal.

9. The system of claim 7, further comprising a drive current controller operatively coupled to the gain medium to adjust a drive current applied to the gain medium in response to the second error signal.

10. The system of claim 3 wherein the tunable element comprises a wedge etalon and wherein the tuning characteristic comprises a translatable position of the wedge etalon.

11. The system of claim 10 wherein the wedge etalon comprises a thin film wedge etalon having a half wave layer and a plurality of quarter wave layers.

12. The system of claim 3 wherein the tunable element comprises an electro-optic tunable element and wherein the tuning characteristic comprises a voltage.

13. The system of claim 12 wherein the electro-optic tunable element comprises a liquid crystal material having an index of refraction, wherein the voltage is to be applied across the liquid crystal material, the index of refraction adjustable in response to the voltage.

14. The system of claim 3 wherein the tunable element comprises a micro-electrical-mechanical system ("MEMS") device having an air gap and wherein the tuning characteristic comprises a voltage applied to electrodes of the MEMS device to adjust a moveable reflective surface associated with the air gap.

15. The system of claim 14 wherein the MEMS device, the gain medium, the reflective element, and the first optical detector are fabricated from a single bulk semiconductor substrate.

16. The system of claim 3 wherein the tunable element comprises a partially transmissive diffraction grating and wherein the tuning characteristic comprises an angular position of the diffraction grating.

17. The system of claim 16 wherein the diffraction grating comprises a chirped diffraction grating including a first end and a second end, the first end having a wider grating spacing than the second end.

18. The system of claim 17 wherein the first optical detector is positioned in a near field of the chirped diffraction grating.

19. The system of claim 16 wherein the diffraction grating comprises an unchirped diffraction grating and wherein the first optical detector is positioned in a far field of the unchirped diffraction grating.

20. The system of claim 1, further comprising a grid generator positioned in the optical path to receive the optical beam, the grid generator positioned between the gain medium and the reflective element.

21. The system of claim 1, further comprising:
a second optical detector positioned to receive a second portion of the optical beam and to generate a second error signal; and
a drive current controller operatively coupled to the gain medium to adjust a drive current applied to the gain medium in response to the second error signal.

22. A method, comprising:
generating a coherent optical beam directed along an optical path;
selecting a wavelength of the coherent optical beam;
diffracting the coherent optical beam to generate a constructive interference fringe; and
generating an error signal in response to the constructive interference fringe.

23. The method of claim 22 wherein generating the error signal comprises detecting a location of the constructive interference fringe impinging upon an optical detector and generating the error signal in response to the location.

24. The method of claim 23, further comprising adjusting the location of the constructive interference fringe in response to the error signal.

25. The method of claim 24 wherein adjusting the location of the constructive interference fringe and selecting the wavelength of the coherent optical beam comprise adjusting a tuning characteristic of a tunable element in response to the error signal, the tunable element positioned to receive the coherent optical beam to select the wavelength of the coherent optical beam and to diffract the coherent optical beam to generate the constructive interference fringe.

26. The method of claim 25 wherein adjusting the tuning characteristic of the tunable element comprises positionally translating the tunable element.

27. The method of claim 25 wherein adjusting the tuning characteristic of the tunable element comprises rotating the tunable element.

28. The method of claim 25 wherein adjusting the tuning characteristic of the tunable element comprises adjusting a voltage applied across the tunable element.

29. The method of claim 23 wherein detecting the location of the constructive interference fringe comprises detecting first and second optical power of the constructive interference fringe impingent upon first and second halves of the optical detector, respectively.

30. The method of claim 29 wherein generating the error signal further comprises determining a difference between the first optical power and the second optical power and generating the error signal based upon the difference.

31. The method of claim 30, further comprising adjusting the location of the constructive interference fringe impinging upon the optical detector in response to the error signal.

32. The method of claim 31 wherein adjust the location of the constructive interference fringe comprises adjusting the location of the constructive interference fringe to center the constructive interference fringe on the optical detector.

* * * * *